United States Patent
Yamagami et al.

[11] Patent Number: 5,540,781
[45] Date of Patent: Jul. 30, 1996

[54] PLASMA CVD PROCESS USING A VERY-HIGH-FREQUENCY AND PLASMA CVD APPARATUS

[75] Inventors: Atsushi Yamagami; Nobuyuki Okamura, both of Kawasaki; Satoshi Takaki, Komae, all of Japan

[73] Assignee: Canon Kabushiki Kaisha, Tokyo, Japan

[21] Appl. No.: 338,617

[22] PCT Filed: Mar. 23, 1994

[86] PCT No.: PCT/JP94/00462

§ 371 Date: Nov. 23, 1994

§ 102(e) Date: Nov. 23, 1994

[30] Foreign Application Priority Data

Mar. 23, 1993 [JP] Japan .................................. 5-063973

[51] Int. Cl.⁶ .......................... C23C 16/00; H05H 1/20
[52] U.S. Cl. ............ 118/723 E; 427/573; 118/723 MP; 118/730; 204/298.34
[58] Field of Search .................. 118/723 MR, 723 MA, 118/723 MP, 723 F, 723 HC; 156/345; 204/298.34, 298.37; 315/111.81, 111.41, 111.31; 427/573, 588, 585

[56] References Cited

U.S. PATENT DOCUMENTS

| | | | |
|---|---|---|---|
| 4,631,105 | 12/1986 | Carroll et al. ............................ | 156/345 |
| 4,909,183 | 3/1990 | Kamiya et al. ....................... | 118/723 E |
| 4,958,591 | 9/1990 | Yamazaki ............................. | 118/723 E |
| 5,016,565 | 5/1991 | Saitoh et al. ....................... | 118/723 MP |
| 5,129,359 | 7/1992 | Takei et al. ........................ | 118/723 MP |
| 5,272,417 | 12/1993 | Ohmi .................................. | 315/111.21 |
| 5,383,984 | 1/1995 | Shimada et al. ......................... | 156/345 |
| 5,399,830 | 3/1995 | Maruyama ........................... | 219/121.43 |
| 5,433,790 | 7/1995 | Niino et al. ....................... | 118/723 MP |
| 5,439,715 | 8/1995 | Okamura .......................... | 118/723 MP |
| 5,460,707 | 10/1995 | Wellerdieck ....................... | 204/298.08 |

*Primary Examiner*—R. Bruce Beneman
*Assistant Examiner*—Joni Y. Chang
*Attorney, Agent, or Firm*—Fitzpatrick, Cella, Harper & Scinto

[57] ABSTRACT

A VHF plasma CVD process in which a cathode electrode is electrically divided into a plurality of elements in the axial direction of a cylindrical substrate, and a very-high-frequency energy with a frequency in the range of 60 MHz to 300 MHz is supplied to each of the divided cathode electrode elements by way of a high frequency power supply means for generating a plasma in a reaction chamber thereby forming a deposited film; and a VHF plasma CVD apparatus suitable for carrying out the VHF plasma process.

25 Claims, 21 Drawing Sheets

1

PLASMA CVD PROCESS USING A VERY-HIGH-FREQUENCY AND PLASMA CVD APPARATUS

FIELD OF THE INVENTION

The present invention relates to a plasma CVD process using a very-high-frequency which can attain the formation of a homogeneous large area deposited film having a uniform thickness at a high deposition rate and a plasma CVD apparatus suitable for practicing said plasma CVD process. More specifically, the present invention relates to a plasma CVD process which enables to form a homogeneous large area deposited film having a uniform thickness for large area devices such as electrophotographic photosensitive members at a relatively high deposition rate, using a frequency in a frequency range which is higher than that used in the conventional RF plasma CVD process and a plasma CVD apparatus suitable for practicing said plasma CVD process.

BACKGROUND OF THE INVENTION

In recent years, the so-called RF plasma CVD process has been frequently used for the production of semiconductor devices. In the RF plasma CVD process, a high frequency of 13.56 MHz is generally used in view of the Wireless Telegraphy Act. The RF plasma CVD process has advantages in that the discharge conditions can be relatively easily controlled and the quality of a film obtained is excellent, but it has drawbacks in that the utilization efficiency of a gas is not sufficient and the deposition rate of a film is relatively small. In order to solve these drawbacks in the RF plasma CVD process, there has been proposed a microwave plasma CVD process using the so-called microwave with a frequency of 2.45 GHz. The microwave CVD process has advantages in that the utilization efficiency of a gas is sufficient and the deposition rate of a film can be significantly increased, but has drawbacks in that the plasma density upon film formation is significantly high and thereby a raw gas is abruptly decomposed and the film deposition is made at a high deposition rate so that it is very difficult to stably form a dense film.

In view of the foregoing, studies have been recently made for a plasma CVD process using a very-high-frequency of the so-called VHF range, having a frequency of 30 MHz to 150 MHz which is greater than the 13.56 MHz. For example, in Plasma Chemistry and Plasma Proceeding, Vol. 7, No. 3, pp/267–273 (1987) (hereinafter, referred to as Document 1), there is described a film-forming technique using a glow discharge decomposition apparatus of a capacitance coupling type wherein a raw gas (silane gas) is decomposed by a very-high-frequency energy of 25 MHz to 150 MHz to form an amorphous silicon (a-Si) film. Specifically, Document 1 describes that a-Si films are formed with the frequency changed in the range of 20 MHz to 150 MHz, and in the case of using a frequency of 70 MHz, the film deposition rate becomes the maximum value, 21 Å/sec, which is about 5 to 8 times that in the RF plasma CVD process; and that the defect density, optical band gap and conductivity of the resulting a-Si film are not affected by the exciting frequency so much. Document 1, however, only discloses the film formation on a laboratory scale, and it does not describe whether or not the above-described effect are applied to the formation of a large area film at all. In addition, Document 1 merely suggests a possibility that the use of higher frequencies (13.56 MHz to 200 MHz) leads to the interesting perspective for fast processing of an inexpensive and large area a-Si:H film device required for a thickness of several µm. In this regard, as is apparent from the experimental results (described later) by the present inventors, the use of a very-high-frequency energy in the so-called VHF range can achieve the high decomposition efficiency of a gas and high deposition rate, but it cannot bring about the formation of a practically usable large area deposited film. In addition, Japanese Patent Laid-open No. 64466/1991 (hereinafter, referred to as Document 2) discloses a technique of forming an amorphous silicon based semiconductor film on a cylindrical substrate by use of a very-high-frequency energy with a frequency of 20 MHz or more (preferably, 30 MHz to 50 MHz). Specifically, a raw gas is introduced into a reaction chamber; the interior of the reaction chamber is kept at a gas pressure of $10^{-4}$ to 0.2 Torr; and a very-high-frequency energy in an amount corresponding to 0.1 to 10 W/sccm in terms of a ratio to the flow rate of the raw gas is introduced into the reaction chamber to cause glow discharge thereby forming an amorphous silicon based semiconductor film. According to the description of Document 1, a film deposition rate of 10 µm/hr or more can be obtained and the unevenness of the thickness in the deposited film can be suppressed to be 20% or less.

The technique of Document 2, however, fails to obtain the above film deposition rate by use of a very-high-frequency with a frequency beyond the above-described frequency range. Namely, as an experimental result (described later) by the present inventors that the technique described in Document 2 is practiced using a high frequency power supply with a frequency of 40 MHz or more, it is revealed that for the frequency of 60 MHz or more, there occurs the unevenness of the thickness in a deposited film in either of the axial and circumferential directions of a cylindrical substrate, and a film having a good quality cannot be obtained at a high deposition rate.

SUMMARY OF THE INVENTION

An principal object of the present invention is to solve the above-described problems in the prior art, and to provide a plasma CVD process using a high frequency of the VHF range (hereinafter, referred to as VHF plasma CVD process) which is capable of forming a high homogeneous deposited film having an extremely uniform thickness on the surface of a cylindrical substrate in either of the axial and circumferential directions at a high deposition rate.

Another object of the present invention is to provide a VHF plasma CVD process capable of preventing the loss in a high frequency power accompanied by an increase in the frequency of a high frequency power supply thereby efficiently generating a plasma.

A further object of the present invention is to provide a VHF plasma CVD process, wherein a cathode electrode provided around a cylindrical substrate is divided into a plurality of elements in the axial direction of the cylindrical substrate, and a very-high-frequency energy with a frequency in the range of from 60 MHz to 300 MHz is supplied to each of the divided cathode electrode elements by way of a high frequency power supply means for generating a plasma in a reaction chamber, thereby forming a deposited film on the cylindrical substrate.

A still further object of the present invention is to provide a plasma CVD apparatus, wherein a cathode electrode provided around a cylindrical substrate is electrically divided in a plurality of elements in the axial direction of the cylindrical substrate, and a very-high-frequency energy with a frequency in the range of from 60 MHz to 300 MHz is supplied to each of the divided cathode electrode elements by way of a high frequency power supply means.

A VHF plasma CVD process of the present invention for achieving the above objects includes the following two preferred modes. Namely, according to the first preferred mode of the process of the present invention, there is provided a VHF plasma process comprising the steps of: supplying a raw gas for film formation to a reaction chamber under a reduced pressure; supplying a high frequency power generated by a high frequency power supply having a frequency in the VHF range to a cathode electrode provided around a cylindrical substrate rotatably disposed in the reaction chamber by way of a high frequency power supply means; generating a plasma in a space between the cylindrical substrate and the cathode electrode; and forming a deposited film on the surface of the cylindrical substrate, characterized in that the cathode electrode is electrically divided into a plurality of elements in the axial direction of the cylindrical substrate, and a very-high-frequency energy with a frequency in the range of 60 MHz to 300 MHz is supplied to each of a plurality of the divided cathode electrode elements by way of the high frequency power supply means, thereby generating a plasma in the reaction chamber and forming a deposited film.

According to the second preferred mode of the process of the present invention, there is provided a VHF plasma process comprising the steps of: supplying a raw gas for film formation to a reaction chamber under a reduced pressure; supplying a high frequency power generated by a high frequency power supply having a frequency in the VHF range to a cathode electrode provided around a cylindrical substrate rotatably disposed in the reaction chamber by way of a high frequency power supply means; generating a plasma in a space between the cylindrical substrate and the cathode electrode; and forming a deposited film on the surface of the cylindrical substrate, characterized in that the cathode electrode is electrically divided into a plurality of elements in the axial direction of the cylindrical substrate, each of the divided cathode electrode elements has independently a plurality of contact points connected to the high frequency power supply means, and a very-high-frequency energy with a frequency in the range of 60 MHz to 300 MHz is supplied to each of a plurality of the divided cathode electrode elements by way of a plurality of the contact points, thereby generating a plasma in the reaction chamber and forming a deposited film.

The present invention includes a plasma CVD apparatus suitable for carrying out the above-described plasma CVD process. Namely, a plasma CVD apparatus of the present invention has the following two preferred modes. According to the first preferred mode of the apparatus of the present invention, there is provided a plasma CVD apparatus comprising: a reaction chamber capable of being reduced in pressure; a raw gas supply means for supplying a raw gas for forming a deposited film in the reaction chamber; a substrate support means rotatably disposed in the reaction chamber; a cathode electrode provided around a cylindrical substrate disposed by the substrate support means, and a high frequency power supply with a frequency in the VHF range, wherein a high frequency power generated by the high frequency power supply with a frequency in the VHF range is supplied to the cathode electrode by means of the high frequency power supply means for generating a plasma in a space between the cylindrical substrate and the cathode electrode thereby forming a deposited film on the surface of the cylindrical substrate, characterized in that the cathode electrode is electrically divided into a plurality of elements in the axial direction of the cylindrical substrate, and a very-high-frequency energy with a frequency in the range of 60 MHz to 300 MHz is supplied to each of the divided cathode electrode elements by way of the high frequency power supply means.

According to the second preferred mode of the apparatus of the present invention, there is provided a plasma CVD apparatus comprising: a reaction chamber capable of being reduced in pressure; a raw gas supply means for supplying a raw gas for forming a deposited film in the reaction chamber; a substrate support means rotatably disposed in the reaction chamber; a cathode electrode provided around a cylindrical substrate disposed by the substrate support means, and a high frequency power supply with a frequency in the VHF range, wherein a high frequency power generated by the high frequency power supply with a frequency in the VHF range is supplied to the cathode electrode by means of the high frequency power supply means for generating a plasma in a space between the cylindrical substrate and the cathode electrode thereby forming a deposited film on the surface of the cylindrical substrate, characterized in that the cathode electrode is electrically divided into a plurality of elements in the axial direction of the cylindrical substrate, each of the divided cathode electrode elements has independently a plurality of contact points connected to the high frequency power supply means, and a very-high-frequency energy with a frequency in the range of 60 MHz to 300 MHz is supplied to each of the divided cathode electrode elements by way of a plurality of the contact points.

According to the present invention, it becomes possible to stably form a high homogeneous deposited film having an extremely uniform thickness on a surface of the cylindrical substrate in either of the axial and circumferential directions at a high deposition rate. In general, when the frequency of a high frequency power supply used for film formation is increased, the loss in the high frequency energy is increased linearly with the frequency; however, in the present invention, despite the use of a very-high-frequency energy in a large frequency range, such an energy loss is extremely low, and a raw gas is efficiently decomposed to generate a desired plasma, thus forming a desired deposited film at a high deposition rate.

To solve the above-described problems in the prior art VHF plasma CVD techniques and to achieve the above-described objects of the present invention, the following experiments have been made. The present invention has bee accomplished on the basis of the knowledge (described later) obtained by the experiments.

EXPERIMENT 1

This experiment was made on the technique described in the above-described Document 2 (Japanese Patent Laid-open No. HEI 3-64466). Electrophotographic photosensitive members, each having a photosensitive layer composed of a plurality of amorphous silicon films, were prepared using a high frequency power source capable of generating various frequencies. In the course of preparation of electrophotographic photosensitive members, observations were made to examine the effect of the frequency of the high frequency power source exerted on both the unevenness of the thickness in the deposited film and the deposition rate. The characteristics of the resultant electrophotographic photosensitive members were also observed. The electrophotographic photosensitive members were prepared using a plasma CVD apparatus shown in FIG. 1. In FIG. 1, reference numeral 100 indicates a reaction chamber. The reaction chamber 100 includes a base plate 101, a cylindrical insulating member 102A disposed on the base plate 101, a cylindrical cathode electrode 103 (inside diameter: 208 mm, length: 400 mm), and a cylindrical insulating member 102B. Reference numeral 115 indicates an upper cover for the reaction chamber 100.

Reference numeral 105A indicates a substrate holder, which internally includes a heater column 105A'. Reference numeral 105A" indicates a heater mounted around the heater column 105A' for heating the substrate. Reference numeral 106 indicates a cylindrical substrate disposed on the substrate holder 105A. Reference numeral 105B indicates an auxiliary support member for supporting the cylindrical substrate 106. The substrate holder 105A internally includes a rotary mechanism (not shown) connected to a motor, and can be rotated, as needed. Reference numeral 107 indicates an exhaust pipe having an exhaust valve, and which is communicated to an exhaust mechanism 107' having a vacuum pump. Reference numeral 108 indicates a raw gas supply system composed of gas reservoirs, mass-flow controllers, valves and the like. The raw gas supply system 108 is connected to a gas discharge pipe 116 having a plurality of gas discharge holes by way of a gas supply pipe 117. A raw gas is supplied in the reaction chamber by way of a plurality of gas discharge holes of the gas discharge pipe 116. Reference numeral 111 indicates a high frequency power supply. A high frequency power is supplied from the high frequency power supply 111 to the cathode electrode 103 by way of a high frequency power supply line 118 and a matching circuit 109. Reference numeral 104 indicates a shield wall.

In this experiment, 18 pieces of Al made cylindrical substrates (diameter: 108 mm, length: 358 mm, thickness: 5 mm) were prepared. A charge injection inhabitation layer, a photoconductive layer and a surface protective layer were formed in this order on each of the Al made cylindrical substrates, using the plasma CVD apparatus shown in FIG. 1, under the conditions shown in Tables 1 and 2, thus preparing each electrophotographic photosensitive member. In this way, 18 pieces of electrophotographic photosensitive members (Sample Nos. 1a, 2a, 2b, 3a, 3b, 4a, 4b, 5a, 5b, 6a, 6b, 7a, 7b, 8a, 8b, 9a, 9b and 10a) were prepared. Of these samples of the electrophotographic photosensitive members, those suffixed with the symbol "a" are obtained by the film formation in which the cylindrical substrate is rotated, and those suffixed with the symbol "b" are obtained by the film formation in which the cylindrical substrate is not rotated. The Al made cylindrical substrate 106 was disposed on the substrate holder 105A, and the interior of the reaction chamber 100 was evacuated by operation of the exhaust mechanism 107' to adjust the interior of the reaction chamber 100 at a pressure of $1 \times 10^{-6}$ Torr. The heater 105" was energized to heat the cylindrical substrate 106 at a temperature of 250° C. and to keep it at the same temperature. A charge injection inhabitation layer was formed under the condition shown in the column of charge injection inhabitation layer in Table 1. Specifically, $SiH_4$ gas, $H_2$ gas, NO gas, $B_2H_6$ gas were introduced in the reaction chamber in respective flow rates of 500 sccm, 10 sccm, 10 sccm, and 2000 ppm from the raw gas supply means 108 by way of the gas supply pipe 117 and the gas discharge pipe 116, and the pressure in the reaction cheer was adjusted at 50 mTorr or 500 mTorr. Subsequently, each high frequency in the range of from 13.56 MHz to 350 MHz, shown in Table 2, was generated by the high frequency power supply 111, and was supplied to the cathode electrode 103 by way of the high frequency power supply line 118 and the matching circuit 109. The high frequency power supply 111 was selected to give each frequency in the above range. The matching circuit 109 was suitably adjusted in accordance with each frequency of the high frequency power supply. In the space surround by the cylindrical substrate 106 and the cathode electrode 103, the above raw gas was excited and decomposed by the high frequency energy, to form an amorphous silicon film (a-Si:H:N:O:B film) as a charge injection inhabitation layer on the cylindrical substrate 106 to a thickness of about 1 μm. Similarly, a photoconductive layer composed of an a-Si:H film having a thickness of about 25 μm was formed under the condition shown in the column of photoconductive layer in Table 1. Moreover, a surface protective layer composed of an a-SiC:H film having a thickness of about 1 μm was formed under the condition shown in the column of surface protective layer in Table 1. Thus, an electrophotographic photosensitive member was prepared. The above film formation was repeatedly performed by changing the frequency and the internal pressure in the reaction chamber upon film formation for each sample of electrophotographic photosensitive member. Additionally, in preparation of the samples suffixed with the symbol "a", the cylindrical substrate was rotated by operation of the rotary mechanism. In preparation of the samples suffixed with the symbol "b", the cylindrical substrate was not rotated.

As for the Sample Nos. 2a, 2b, 3a, 3b, 4a, 4b, 5a, 5b, 6a, 6b, 7a, 7b, 8a, 8b, 9a and 9b, two pieces of the samples were prepared. Of these two samples, one was used for evaluation of the film thickness distribution; and the other was used for evaluation of the electrophotographic characteristic.

In the film formation of Sample No. 1a using the frequency of 13.56 MHz, the discharge was interrupted at the pressure of 50 mTorr, with a result that the film formation could not performed. Consequently, in the case of Sample Nos. 2a and 2b, the film formation was performed at a pressure of 500 mTorr.

As for each of Samples Nos. 2a, 2b to 9a, 9b, the film formation was performed under the conditions shown in Table 1. In the case of Sample No. 10a, like Sample No. 1a, the discharge was interrupted, with a result that the film formation could not be performed. In each of Sample Nos. 2a, 2b to 9a, 9b, the film thickness of the substrate 6 was measured at 100 intersections of the axial lines drawn at intervals of 33 mm and the circumferential lines drawn at intervals of 32 mm, using an eddy current film thickness measuring instrument (sold by Kett Science Laboratory Company); and the film thickness distribution was evaluated on the basis of the measured film thickness. Here, the evaluation of the film thickness distribution was performed as follows: As for the axial film thickness distribution, there was obtained a difference between the maximum value and the minimum value among the values of film thickness at ten measured points along one row in the axial direction; the difference is divided by the mean value among the values at ten points, thus obtaining the film thickness distribution {(maximum value−minimum value)/mean value} per one row. For the other nine rows, the film thickness distribution per one row was similarly obtained. The mean value among the values of film thickness distribution for the ten rows was calculated, which was shown in Table 3 on a percentage basis as the axial film thickness distribution (that is, unevenness of the film thickness). As for the circumferential film thickness distribution, there was obtained a difference between the maximum value and the minimum value among the values of film thickness at ten measured points along one line in the circumferential direction; the difference is divided by the mean value among the values at ten points, thus obtaining the film thickness distribution {(maximum value−minimum value)/mean value} per one line. For the other nine lines, the film thickness distribution per one line was similarly obtained. The mean value among the values of film thickness distribution for the ten lines was calculated, which was shown in Table 3 on a percentage basis as the circumferential film thickness distribution (that is, unevenness of the film thickness). For the sample in which the film thickness distribution is more than 20%, the deposition rate was not calculated. For the sample in which the film thickness distribution (unevenness of the film thickness) was less than 20%, the deposition rate was calculated on the basis of each of the values of film thickness at the 100 points, and the mean value thereof was shown as the deposition rate of the sample in Table 3. Next, each of Sample Nos. 2a, 2b to 9a, 9b was mounted in an electrophotographic copying machine (an experimental modification of NP6060 sold by CANON), and was evaluated for the electrostatic charging ability and the image density. The results are shown in Table 3. The evaluation for the electrostatic charging ability and the image density was performed as follows:

Evaluation for Electrostatic Charging Ability

Each sample was mounted in the electrophotographic copying machine, being subjected to corona charging by a charging device applied with a voltage of +6 kV, and was measured in the surface potential in dark on the surface by means of a surface potentiometer. The measurement was performed at each of the same 100 points as used in the above evaluation of the film thickness distribution, and a mean value was obtained among the measured values. The value being the most distant from the mean value evaluated on the basis of the following criteria.

⊚: less than 10 V, very good in uniformity
○: less than 20 V, good in uniformity
Δ: less than 30 V, no problem in practice
×: more than 30 V, poor in uniformity and insufficient for use in high speed coping machine Evaluation for Image Density A whole halftone original (Halftone Test Chart FY9-9042 sold by CANON) was positioned on the original table of the electrophotographic copying machine, and was subjected to image formation. Each of the image samples thus obtained was evaluated on the basis of the following criteria:
⊚: very good image, with uneven image density
○: good image, with slight uneven image density
Δ: acceptable image, with whole uneven image density
×: not acceptable image, with significant uneven image density From the above-described experiment, the following results were obtained.

(i) In the film formation in which the substrate is rotated, when the power supply frequency is larger than 40 MHz, the unevenness of the film thickness in the axial direction is increased depending on the frequency, but the unevenness of the film thickness in the circumferential direction is suppressed at a small value not depending on the power supply frequency; (ii) in the film formation in which the substrate is not rotated, when the power supply frequency is larger than 40 MHz, the unevenness in the film thickness in either the axial or circumferential direction is increased depending on the frequency; and (iii) when the power supply frequency is more than 40 MHz, the image characteristics of the electrophotographic photosensitive member is made poor, irrespective of either case where the substrate is rotated or not rotated.

EXPERIMENT 2

On the basis of the results obtained by Experiment 1, this experiment was made to examine the possibility in forming a deposited film without unevenness of thickness even when the frequency of the high frequency power supply used is larger than 40 MHz for obtaining an electrophotographic photosensitive member composed of the deposited film which is excellent in electrostatic charging ability and copied image. In this experiment, the film formation was performed using a plasma CVD apparatus modified from the apparatus used in Experiment 1 in that the cathode electrode is provided with a plurality of contact points with the high frequency power supply line for supplying a high frequency power to the cathode electrode, and a power is supplied to the cathode electrode from a plurality of the contact points. The plasma CVD apparatus used in this experiment has the construction as shown in FIG. 2. The plasma CVD apparatus shown in FIG. 2 has the same construction as that of the apparatus shown in FIG. 1, except that the high frequency power supply line 118 for supplying a high frequency power generated by the high frequency power supply 118 to the cathode electrode 103 is branched into two parts 118A and 118a on the side of the cathode electrode 103 relative to the matching circuit 109, and a power is supplied to the cathode electrode 103 from the contact point between the line 118A and the cathode electrode 103 and the contact point between the line 118a and the cathode electrode 103. The same parts as those in the plasma CVD apparatus shown in FIG. 1 are indicated at the same reference numerals, and the explanation thereof is omitted. In addition, the contact point between the high frequency power supply line 118A and the cathode electrode 103 and the contact point between the high frequency power supply line 118a and the cathode electrode 103 were provided to be symmetric to each other relative to the cylinder substrate 106. In this experiment, Sample Nos. 12a, 12a to 19a, 19b were prepared in the same conditions as those used for preparing Sample Nos. 2a, 2b to 9a, 9b in Experiment 1. Each of these samples was evaluated in the same manner as in Experiment 1. The results are shown in Table 4.

From Table 4, the following results were obtained.

(i) The unevenness of the film thickness in the circumferential direction of the substrate can be suppressed at a small value by supplying a power to the cathode electrode from a plurality of the contact points; (ii) the unevenness of the film thickness in the axial direction is slightly suppressed by supplying a power to the cathode electrode from a plurality of the contact points as compared with the case of supplying a power from one contact point (Table 3); however, when the power supply frequency is larger than 40 MHz, the unevenness of the film thickness in the axial direction is increased depending on the power supply frequency irrespective of either case where the substrate is rotated or not rotated; and (iii) when the power supply frequency is larger than 100 MHz, the image characteristics of an electrophographic photosensitive member obtained is insufficient, irrespective of either case where the substrate is rotated or not rotated.

EXPERIMENT 3

On the basis of the results of the above-described Experiments 1 and 2, this experiment was made to examine the cause of the generation of the increased unevenness of the film thickness in the axial direction of the cylindrical substrate when a high frequency power supply with a frequency more than 40 MHz is used. With respect to the cause of the generation of the increased unevenness of the film thickness in the axial direction of the cylindrical substrate in the plasma CVD apparatuses used in Experiments 1 and 2, the present inventors considered as follows: Namely, a high frequency power is supplied from a high frequency power supply to a cathode electrode by way of a thinned portion of the surface of the cathode electrode because of the so-called skin effect, that is, it is supplied only by way of the portion in the vicinity of the surface of the cathode electrode and does not pass through the deep portion of the cathode electrode. The skin effect becomes significant as the frequency of the high frequency power supply is increased, and a high frequency power passes through only an extremely thin portion near the surface of the electrode. In this case, the resistance of the cathode electrode is increased; consequently, the high frequency power becomes further difficult to be transmitted. This is well known in the technical field of the plasma CVD process. In the plasma CVD apparatuses used in Experiments 1 and 2, a power is supplied from the outer peripheral portion of the cylindrical cathode electrode 103 connected to the high frequency power supply line 118 to the inner peripheral portion along the surface of the electrode. When the frequency of the supplied high frequency power is high, the power is consumed as a discharge generating energy in the vicinity of the upper or lower end portion of the cylindrical substrate 106 before reaching the inner peripheral center portion of the cylindrical cathode electrode 103 opposed to the cylindrical substrate 106. Accordingly, a difference in plasma density is generated between the portion near each end of the cylindrical substrate and the center portion thereof, and which seems to cause the unevenness of the film thickness in the axial direction. In view of the foregoing, in this experiment, using a plasma CVD apparatus shown in FIG. 3 wherein a plasma density measuring probe 130 is disposed in the plasma CVD apparatus shown in FIG. 1, the plasma density in the discharge space surrounded by the cylindrical substrate 106 and the cylindrical cathode electrode 103 was measured at various positions. In FIG. 3, reference numeral 131 indicates a seal flange. Reference numeral 130 indicates a probe, which is designed to be vertically movable. The plasma density (electron density: $N_e$) can be obtained, in the following equation, on the basis of a thermal diffusion electron current $I_{eo}$ and an electron temperature $T_e$ measured by a single probe method.

$$N_e = 3.73 \times 10^{11} \times I_{eo} \div S \div T_e^{1/2}$$

(where S is a surface area of the probe)

In this experiment, the effect of the frequency exerted on the plasma density was examined using a high frequency power supply with each of frequencies of 40 MHz and 100 MHz. Specifically, a photoconductive layer shown in Table 1 was formed under the same conditions as those used for preparation of Sample No. 3a (frequency: 40 MHz) and Sample No. 5a (frequency: 100 MHz) in Experiment 1, and during the formation of the photoconductive layer, the probe 103 was vertically moved to measure the plasma density in the discharge space between the cylindrical substrate 106 and the cylindrical cathode electrode 103. The relationship between the position of the probe and the plasma density is plotted in FIGS. 4 and 5. In FIGS. 4 and 5, the position equivalent to ½ of the height of the cylindrical substrate 106 (height: 358 mm) is set at zero on the basis of the substrate holder 105A, and the upper and lower sides relative to the zero point are respectively made to be plus and minus. As is apparent from FIG. 4, in the case of using the high frequency power supply with a frequency of 40 MHz, a relatively uniform plasma density can be obtained over the range of 358 mm or more on which the cylindrical substrate 106 is disposed. On the contrary, as is apparent from FIG. 5, in the case of using the high frequency power supply with a frequency of 100 MHz, there occurs a large difference in the plasma density within the range of 358 mm on which the cylindrical substrate 106 is disposed, and the plasma density is lowest near the position of ½ of the height of the cylindrical substrate 106 (that is, near the zero point), and the plasma density is increased in the direction nearing the end portion of the substrate. With respect to the silicon film formed on the cylindrical substrate 106 using the high frequency power with a frequency of 40 MHz and the silicon film formed on the cylindrical substrate using the high frequency power with a frequency of 100 MHz, the film thickness distribution was examined in the same manner as in Experiment 1. As a result, it was revealed that the former silicon film is dependent on the plasma density distribution shown in FIG. 4 and thereby it exhibits a relatively uniform film thickness distribution; while the latter silicon film is dependent on the plasma density distribution shown in FIG. 5, and thereby it exhibits an non-uniform film thickness distribution.

EXPERIMENT 4

On the basis of the results of Experiment 3, in this experiment, an examination was made using a plasma CVD apparatus capable of lowering the skin effect and reducing an variation in the plasma density in the discharge space surrounded by the cylindrical substrate 106 and the cylindrical cathode electrode 103. In the plasma CVD apparatus, a cathode electrode is electrically divided into a plurality of elements in the axial direction of the cylindrical cathode electrode, and a high frequency power can be supplied to the divided cathode electrode elements. In this experiment, the plasma density in the discharge space between the cylindrical substrate 106 and the cylindrical cathode electrode 103 was measured using the above plasma CVD apparatus. The plasma CVD apparatus used in this experiment has a construction shown in FIG. 6. The plasma CVD apparatus shown in FIG. 6 is partially modified from the plasma CVD apparatus shown in FIG. 3. The plasma CVD apparatus shown in FIG. 6 has a cathode electrode which is electrically divided into three elements 103A (height: 75 mm), 103B (height: 230 mm) and 103C (height: 75 mm) in the axial direction of the cylindrical substrate. Insulating members 121A and 121B, each of which has a height of 10 mm, are respectively disposed between the cathode electrode elements 103A and 103B, and between the cathode electrode elements 103B and 103C. Reference numeral 120 indicates a high frequency power distributor. Reference numerals 109A, 109B and 109C indicate matching circuits. A high frequency power generated by the high frequency power supply 111 is divided into three components by the high frequency power dividing means 120, and are supplied to the cathode electrode elements 109A, 109B and 109C by way of the matching circuits 109A, 109B and 109C. The power was distributed such that the power supply amount per unit area of the cathode electrode becomes substantially equal among the three cathode electrode elements. The other construction is the same as that of the plasma CVD apparatus shown in FIG. 3. In this experiment, the film formation was performed in the same manner as in Experiment 3 using the plasma CVD apparatus, shown in FIG. 6, connected to a high frequency power supply with each of frequencies of 40 MHz and 100 MHz, and the plasma density was measured in the same manner as in Experiment 3. In formation of a photoconductive layer, a power of 200 W was supplied to the cathode electrode elements 103A and 103C, and a power of 600 W was supplied to the cathode electrode element 103B. The relationship between the position of the probe and the plasma density is plotted in FIGS. 7 and 8. As is apparent from FIGS. 7 and 8, in either case of using the high frequency power supply with a frequency of 40 MHz and using the high frequency power supply of a frequency of 100 MHz, the plasma density is substantially uniform over the range of 358 mm or more on which the cylindrical substrate 106 is disposed. However, the plasma density for the frequency of 40 MHz is larger than that in the case of the frequency of 100 MHz. From this experiment, the following results can be obtained. Even in the case of using a high frequency power supply with a frequency of 100 MHz, the plasma density in the axial direction of the cylindrical substrate can be made substantially uniform by use of the cathode electrode divided into a plurality of elements in the axial direction of the cylindrical substrate.

EXPERIMENT 5

On the basis of the results of the above-described Experiment 4, each of electrophotographic photosensitive member was prepared using a plasma CVD apparatus in which a cathode electrode is divided in a plurality of elements in the axial direction of a cylindrical substrate, and was examined for the electrophotographic characteristics. In this experiment, a plasma CVD apparatus shown in FIG. 9 was used. The plasma CVD apparatus shown in FIG. 9 has the same construction as that of the plasma CVD apparatus shown in FIG. 6, except that the probe 130 and the seal flange 131 for measuring plasma density are removed. In this experiment, the film formation was performed by variously changing the frequency of the high frequency power supply connected to the plasma CVD apparatus shown in FIG. 9, and a high frequency power generated by the high frequency power supply 111 is divided into three components by the high frequency power distributor 120 and supplied to the cathode electrode elements 109A, 109B and 109C by way of the matching circuits 109A, 109B and 109C. Specifically, Sample Nos. 22a, 22b to 29a, 29b of electrophotographic photosensitive members were prepared in the same conditions as those used for preparation of Sample Nos. 2a, 2b to 9a, 9b in Experiment 1. In addition, Sample Nos. 30a (substrate; rotated) and 30b (substrate; not rotated) were prepared in the same condition as that of the other samples except that a high frequency power supply with a frequency of 350 MHz was used. Each of these samples was evaluated in the same manner as in Experiment 1. The results are shown in Table 5. In addition, as for Sample Nos. 30a and 30b using the high frequency power supply with a frequency of 350 MHz, abnormal discharge was occasionally generated and thereby the stable film formation could not be performed.

From the data shown in Table 5, the following results can be obtained.

(i) In the film formation in which the cathode electrode is divided into a plurality of elements in the axial direction of a cylindrical substrate and a power is supplied to the divided cathode electrode elements, even when a high frequency power supply with a frequency of 60 MHz or more is used, the unevenness of the film thickness in the axial direction of the cylindrical substrate can be suppressed at a small value; (ii) in the case where the film formation is made while rotating a cylindrical substrate and a high frequency power supply with a frequency in the range of from 60 MHz to 300 MHz is used, a deposited film excellent in the electrophographic characteristics can be formed at a high deposition rate of 40 µm/h or more; (iii) in the film formation in which a cylindrical substrate is rotated, when a high frequency power supply with a frequency of 200 MHz is used, the deposition rate is maximized, and when the frequency is further increased, the deposition rate is lowered and the unevenness of the film thickness is increased; and (iv) in the film formation in which a cylindrical substrate is not rotated, when a high frequency power supply with a frequency of 60 MHz or more is used, the unevenness of the film thickness in the circumferential direction of the cylindrical substrate is increased, and a deposited film excellent in the electrophotographic characteristics cannot be formed.

EXPERIMENT 6

According to the above-described Experiment 5, it was revealed that a deposited film excellent in the electrophotographic characteristic can be formed by the film formation in which a high frequency power supply with a frequency of 60 MHz or more is used and a cylindrical substrate is rotated. This experiment was made to examine whether or not a deposited film excellent in the electrophotographic characteristics can be formed even when a cylindrical substrate is not rotated. In this experiment, on the basis of the knowledge that the unevenness of the film thickness in the circumferential direction of a cylindrical substrate can be suppressed by supplying a power to the cathode electrode from a plurality of contact points in the above-described Experiment 2, there was fabricated a plasma CVD apparatus in which a cathode electrode is divided into a plurality of elements in the axial direction of a cylindrical substrate and a power is supplied to the divided cathode electrode elements from a plurality of the contact points; and the film formation was made using this apparatus. The plasma CVD apparatus used in this experiment has a construction shown in FIG. 10, which is partially modified from the apparatus shown in FIG. 9. The plasma CVD apparatus shown in FIG. 10 has the same construction as that of the apparatus shown in FIG. 9, except that the high frequency power supply lines 118A, 118B and 118C for supplying a power to the cathode electrode elements 109A, 109B, and 109C by way of the matching circuits 109A, 109B and 109C are branched in lines 118A, 118a, 118B, 118b, and 118C, 118c, respectively such that a power is supplied to each cathode electrode element from the two contact points. In addition, the contact point between the high frequency power supply line 118A and the cathode electrode element 103A and the contact point between the high frequency power supply line 118a and the cathode electrode element 103A were disposed to be symmetric with each other relative to the cylindrical substrate 106. The same is true for the other contact points between the other power supply lines and the other cathode electrode elements. In this experiment, Sample Nos. 32a, 32b to 39a, 39b were prepared in the same conditions as those used for preparation of Sample Nos. 2a, 2a to 9a, 9b in Experiment 1, using the plasma CVD apparatus shown in FIG. 10. In addition, Sample Nos. 40a (substrate; rotated) and 40b (substrate; not rotated) were prepared in the same condition as that used for the other samples except that a high frequency power supply with a frequency of 350 MHz was used. Each of these samples was evaluated in the same manner as in Experiment 1. The results are shown in Table 6.

From the data shown in Table 6, the following results can be obtained.

(i) In the film formation in which a cathode electrode is divided into a plurality of elements in the axial direction of a cylindrical substrate and a power is supplied to the divided cathode electrode elements from a plurality of contact points, even when the cylindrical substrate is not rotated, the unevenness of the film thickness in the circumferential direction of the cylindrical substrate can be suppressed at a small value; (ii) in the case where the cylindrical substrate is not rotated, a deposited film excellent in the electrophographic characteristics can be formed at a high deposition rate of 40 µm/h or more by use of a high frequency power supply with a frequency in the range of from 60 to 300 MHz; (iii) when the frequency is more than 300 MHz, the unevenness of the film thickness in the axial direction is increased and thereby the electrophotographic characteristics of an electrophographic photosensitive member are made poor; and (iv) from the viewpoint of the deposition rate and the electrophotographic characteristics, the frequency is preferably in the range of from 100 MHz to 250 MHz, more preferably, in the range of from 100 MHz to 200 MHz.

EXPERIMENT 7

From the results of Experiments 4 and 5, it was revealed that in the film formation in which a cathode electrode is divided into a plurality of elements in the axial direction of a cylindrical substrate and a power is supplied to the divided cathode electrode elements, even when a high frequency power supply with a frequency of 60 MHz or more is used, it becomes possible to suppress the unevenness of the film thickness in the axial direction of the cylindrical substrate, and to form a deposited film excellent in the electrophotographic characteristics at a high deposition rate. This experiment was made to examine how the cathode electrode should be divided. In this experiment, first, using a general high frequency power supply with a frequency of 13.56 MHz, it was examined how the length of the cathode electrode is increased while keeping the uniform plasma density between the cylindrical substrate and the cathode electrode. Specifically, the plasma CVD apparatus shown in FIG. 3 for measuring the plasma density was modified so as to examine the following two cases, and the plasma density in the space surrounded by the cylindrical substrate 106 and the cathode electrode 103 was measured using this modified apparatus.

(1) cathode electrode 103 (length: 800 mm, inside diameter: 208 mm), and Al made cylindrical substrate (length: 800 mm, diameter: 108 mm)

(2) cathode electrode 103 (length: 1000 mm, inside diameter: 208 mm), and Al made cylindrical substrate (length: 1000 mm, diameter: 108 mm)

For each of the above cases (1) and (2), the plasma density in the axial direction of the cylindrical substrate was measured in the same manner as in Experiment 3, except that a high frequency power supply with a frequency of 13.56 MHz was used, and the plasma density measuring probe corresponding to the sizes of the cathode electrode and the cylindrical substrate in the above case was used. The results obtained for the above case (1) are plotted in FIG. 11, and the results obtained for the case (2) are plotted in FIG. 12. From the data shown in FIGS. 11 and 12, the following results can be obtained. Namely, for the length of the cathode electrode up to 800 mm, the uniform plasma density can be obtained over the whole range in the longitudinal direction of the cathode electrode; however, for the length of the cathode electrode of 1000 mm, the plasma density is reduced near the center portion of the electrode, and thus the uniform plasma density cannot be obtained. Next, on the basis of the length of the cathode electrode of 800 mm, the following consideration was made.

In the case of a cylindrical cathode electrode having a radius of <a> and a length <l>, an inductance <L> is expressed in the following equation:

$$L = \mu_0/2\pi \times [l \times 1_n \{[1+(a^2+l^2)^{1/2}]/a\} - \{(a^2+l^2)^{1/2}\} - a]$$

(where, $\mu_0$ is a magnetic permeability in vacuum)

For the cathode electrode having a diameter of 208 mm, the impedance Z ($Z=\omega L$) for the cathode electrode length at each frequency was obtained using the above equation. Assuming that the impedance for the cathode electrode length of 800 mm at a frequency of 13.56 MHz is taken as 1.0, the impedance ratio in the case of changing the frequency and the cathode length was obtained, which is shown in FIG. 13. As is apparent from FIG. 13, it was revealed that the impedance ratio was 1.0 or less in the following cases.

frequency: 60 MHz/electrode length: 0.33 mm or less
frequency: 100 MHz/electrode length: 0.25 mm or less
frequency: 200 MHz/electrode length: 0.17 mm or less
frequency: 300 MHz/electrode length: 0.14 mm or less Therefore, it was revealed that when the length of each of the divided cathode elements is set in the above range in accordance with the frequency of the high frequency power supply used, a plasma having the uniform plasma density can be formed in the space between the cylindrical substrate and the cathode electrode.

DETAILED DESCRIPTION OF THE PREFERRED EMBODIMENTS

The present invention has been accomplished on the basis of the above-described Experiments 1 to 6. The present invention includes a VHF plasma process and a plasma CVD apparatus for carrying out the plasma CVD process. The VHF plasma CVD process of the present invention includes the following two preferred modes. Namely, according to the first preferred mode of the apparatus of the present invention, there is provided a VHF plasma process comprising the steps of: supplying a raw gas for film formation to a reaction chamber under a reduced pressure; supplying a high frequency power generated by a high frequency power supply having a frequency in the VHF range to a cathode electrode provided around a cylindrical substrate rotatably disposed in the reaction chamber by way of a high frequency power supply means; generating a plasma in a space between the cylindrical substrate and the cathode electrode; and forming a deposited film on the surface of the cylindrical substrate, characterized in that the cathode electrode is electrically divided into a plurality of elements in the axial direction of the cylindrical substrate, and a very-high-frequency energy with a frequency in the range of 60 MHz to 300 MHz is supplied to each of a plurality of the divided cathode electrode elements by way of the high frequency power supply means, thereby generating a plasma in the reaction chamber and forming a deposited film.

According to the second preferred mode of the process of the present invention, there is provided a VHF plasma process comprising the steps of: supplying a raw gas for film formation to a reaction chamber under a reduced pressure; supplying a high frequency power generated by a high frequency power supply having a frequency in the VHF range to a cathode electrode provided around a cylindrical substrate rotatably disposed in the reaction chamber by way of a high frequency power supply means; generating a plasma in a space between the cylindrical substrate and the cathode electrode; and forming a deposited film on the surface of the cylindrical substrate, characterized in that the cathode electrode is electrically divided into a plurality of elements in the axial direction of the cylindrical substrate, each of the divided cathode electrode elements has independently a plurality of contact points connected to the high frequency power supply means, and a very-high-frequency energy with a frequency in the range of 60 MHz to 300 MHz is supplied to each of a plurality of the divided cathode electrode elements by way of a plurality of the contact points, thereby generating a plasma in the reaction chamber and forming a deposited film.

A plasma CVD apparatus of the present invention includes the following two preferred modes. According to the first preferred mode of the apparatus of the present invention, there is provided a plasma CVD apparatus comprising: a reaction chamber capable of being reduced in pressure; a raw gas supply means for supplying a raw gas for forming a deposited film in the reaction chamber; a substrate support means rotatably disposed in the reaction chamber; a cathode electrode provided around a cylindrical substrate disposed by the substrate support means, and a high frequency power supply with a frequency in the VHF range, wherein a high frequency power generated by the high frequency power supply with a frequency in the VHF range is supplied to the cathode electrode by means of the high frequency power supply means for generating a plasma in a space between the cylindrical substrate and the cathode electrode thereby forming a deposited film on the surface of the cylindrical substrate, characterized in that the cathode electrode is electrically divided into a plurality of elements in the axial direction of the cylindrical substrate, and a very-high-frequency energy with a frequency in the range of 60 MHz to 300 MHz is supplied to each of the divided cathode electrode elements by way of the high frequency power supply means.

According to the second preferred mode of the apparatus of the present invention, there is provided a plasma CVD apparatus comprising: a reaction chamber capable of being reduced in pressure; a raw gas supply means for supplying a raw gas for forming a deposited film in the reaction chamber; a substrate support means rotatably disposed in the reaction chamber; a cathode electrode provided around a cylindrical substrate disposed by the substrate support means, and a high frequency power supply with a frequency in the VHF range, wherein a high frequency power generated by the high frequency power supply with a frequency in the VHF range is supplied to the cathode electrode by means of the high frequency power supply means for generating a plasma in a space between the cylindrical substrate and the cathode electrode thereby forming a deposited film on the surface of the cylindrical substrate, characterized in that the cathode electrode is electrically divided into a plurality of elements in the axial direction of the cylindrical substrate, each of the divided cathode electrode elements has independently a plurality of contact points connected to the high frequency power supply means, and a very-high-frequency energy with a frequency in the range of 60 MHz to 300 MHz is supplied to each of the divided cathode electrode elements by way of a plurality of the contact points.

According to the plasma CVD process and the plasma CVD apparatus of the present invention, it becomes possible to stably form a high homogeneous deposited film having an extremely uniform thickness on the surface of a cylindrical substrate in either of the axial and circumferential directions of the cylindrical substrate. In particular, a deposited film excellent in the electrophotographic characteristics can be stably formed. Moreover, it is possible to prevent the loss in the high frequency power accompanied by an increase in the frequency of a high frequency power supply and effectively generate a plasma, and hence to form a deposited film at a high deposition rate.

Hereinafter, the present invention will be described with reference to the drawings. The plasma CVD apparatus in FIG. 9 shows one example of the first preferred mode of the apparatus according to the present invention. In FIG. 9, reference numeral indicates a reaction chamber. The reaction chamber 100 includes a base plate 101, an insulating member 102A, a cathode electrode element 103C, an insulating member 121B, a cathode electrode 103B, an insulating member 121A, a cathode electrode element 103A, an insulating member 102B and an upper cover 115. Reference numeral 105A indicates a substrate holder, which internally includes a heater column 105A'. Reference numeral 105A" indicates a heater mounted around the heater column 105A' for heating the substrate. Reference numeral 106 indicates a cylindrical substrate disposed on the substrate holder 105A. Reference numeral 105B indicates an auxiliary support member for supporting the cylindrical substrate 106. The substrate holder 105A includes on the bottom portion a rotary mechanism (not shown) connected to a motor, and can be rotated, as needed. Reference numeral 107 indicates an exhaust pipe including an exhaust valve, which is communicated to an exhaust mechanism 107' including a vacuum pump. Reference numeral 108 indicates a raw gas supply system composed of gas reservoirs, mass-flow controllers and valves. The raw gas supply system 108 is connected to a gas discharge pipe 116 having a plurality of gas discharge holes by way of a gas supply pipe 117. A raw gas is supplied within the reaction chamber by way of a plurality of the gas discharge holes of the gas discharge pipe 116. Reference numeral 111 indicates a high frequency power supply. A high frequency power is supplied from the high frequency power supply 111 to the cathode electrode 103 by way of a high frequency power supply line 118 and a matching circuit 109. In the plasma CVD apparatus shown in FIG. 9, the cathode electrode is divided electrically into the three elements 103A, 103B and 103C in the axial direction of the cylindrical substrate. A high frequency power generated at the high frequency power supply 111 is divided into three components by the high frequency power dividing means 120 and supplied to the cathode electrode elements 109A, 109B and 109C by way of the matching circuits 109A, 109B and 109C. Reference numeral 104 indicates a shield wall.

In the plasma CVD apparatus of the present invention, the cylindrical cathode electrode is divided into a plurality of elements, and the divided length is determined depending on the diameter of the cathode electrode and the frequency of a high frequency power supply used. For example, in the case of the cathode electrode having the inside diameter of 208 mm, the divided length is preferably 330 mm or less (frequency: 60 MHz), 250 mm or less (frequency: 100 MHz), 170 mm or less (frequency: 200 MHz ), and 140 mm or less (frequency: 300 MHz). The divided number of an electrode differs depending on the size of a cylindrical substrate. In the case of the cylindrical substrate having an inside diameter of 208 mm and a length of 358 mm, the divided number is preferably 2 or more (frequency: 60 MHz), 2 or more (frequency: 100 MHz), 3 or more (frequency: 200 MHz), and 3 or more (frequency: 300 MHz). In the case where a plurality of cylindrical substrates laminated are formed with a deposited film, the divided number is preferably more than the value determined by dividing the total length of the laminated substrates by the maximum value of the divided cathode length described above, and raising the divided value to an integral number. In the plasma CVD apparatus shown in FIG. 9, a high frequency power supply generated by the high frequency power supply 111 is distributed by the power distributor 120 and is supplied to the cathode electrode; however, as shown in FIG. 14, there may be provided a plurality of high frequency power supplies 111A, 111B and 111C in place of provision of the power distributor.

FIG. 10 shows one example of the second preferred mode of the plasma CVD apparatus of the present invention. In the plasma CVD apparatus shown in FIG. 10, the high frequency power supply lines 118A, 118B and 118C for supplying a power to the cathode electrode elements 109A, 109B and 109C from the matching circuits 109A, 109B and 109C are respectively branched into components 118A, 118a, 118B, 118b, and 118C, 118c such the power is supplied to each cathode electrode element from the two contact points. The other construction of this apparatus is the same as that of the apparatus shown in FIG. 9. FIG. 15 is a sectional view taken along line X—X of the plasma CVD apparatus shown in FIG. 10. In FIG. 15, the power supply lines 118A and 118a branched after the matching circuit 109A (the power distributor is omitted) are connected to the cathode electrode element 103A at the contact points 150A and 150a, respectively. As shown in FIG. 16, the contact points to the cathode electrode element may be set at three points 150D, 150E and 150F. Moreover, as shown in FIG. 17, they may be set at four points 150D, 150E, 150F and 150G. The number of the contact points is preferably two or more, and may be suitably selected according to the diameter of the cathode electrode used. In addition, the contact points may be provided so as to be point-symmetric with each other relative to the cathode electrode.

The plasma CVD process of the present invention is performed as follows. The example using the plasma CVD apparatus shown in FIG. 9 will be described. A cylindrical substrate 106 was set on the substrate holder 105A, and the interior of the reaction cheer was evacuated by operation of the exhaust mechanism 107' to reduce the pressure within the reaction chamber at a desired value. Next, by carrying a current to the heater 105", the substrate 106 was heated and kept at a desired temperature. A raw gas was supplied from the raw gas supply system 108 into the reaction chamber 100 by way of the gas supply pipe 117 and the gas discharge pipe 116, and the interior of the reaction chamber was adjusted at a desired pressure. Thus, a high frequency in the range of from 60 MHz to 300 MHz was generated by the high frequency power supply 111, and a high frequency power was divided into components by the high frequency power distributor 120, and was supplied to the cathode electrode elements 103A, 103B and 103C by way of the matching circuits 109A, 109B and 109C. The raw gas was thus decomposed by the high frequency energy to generate active seeds, thereby forming a deposited film on the cylindrical substrate 106.

The power is desirable to be supplied to each of the divided cathode electrode in the same amount per unit area of electrode; however, it may be made different. Any power may be used so long as it can generate plasma, and preferably in the range of from 0.001 W/cm$^2$ to 10 W/cm$^2$, more preferably, in the range of from 0.01 W/cm$^2$ to 5 W/cm$^2$.

In the present invention, from the viewpoint of the deposition rate and the film quality, the frequency of a high frequency power supply may be in the range of from 60 MHz to 300 MHz, preferably, in the range of from 100 MHz to 250 MHz, more preferably, in the range of from 100 MHz to 200 MHz.

In carrying out the process of the present invention, the gas used is selected from the known materials. For example, the raw gas, which is desirable to form an a-Si based functional deposited film, may include silane, disilane and higher-order silane and a mixed gas thereof. The raw gas, which is desirable to form the other functional deposited films, may include germane, methane, ethylene and a mixed gas thereof.

A carrier gas for supplying a raw gas may include hydrogen or an inert gas such as argon or helium.

As a gas for improving the characteristics, for example, for changing the band gap of a deposited film, there may be used a gas containing nitrogen atoms such as nitrogen or ammonia, a gas containing oxygen atoms such as oxygen, nitrogen oxide, dinitrogen oxide, hydrocarbon gas such as methane, ethane, ethylene, acetylene, propane, gaseous fluorine compound such as silicon tetrafluoride, silicon hexafluoride, germanium tetrafluoride, and a mixed gas thereof.

A dopant gas for doping may include diborane, boron fluoride, phosphine, and phosphorous fluoride.

A pressure within a reaction chamber upon film formation may be suitably selected, and for forming a-Si film, it may be in the range of 5 Torr or less, preferably, in the range of 0.1 mTorr to 3 Torr, more preferably, in the range of from 0.3 mTorr to 500 mTorr.

A substrate temperature upon formation of a deposited film may be suitably selected, and for forming an amorphous silicon based deposited film, it is preferably in the range of from 20° C. to 500° C., more preferably, 50° C. to 450° C.

EXAMPLE

The present invention will be described in more detail by way of the following examples. It should be understood that the present invention is not restricted by these examples.

EXAMPLE 1

Using the apparatus shown in FIG. 9, which was connected to the high frequency power source 111 with a frequency of 100 MHz, an amorphous silicon film was deposited on each substrate in the same manner as in the above-described Experiment 5 under the conditions shown in Table 7, thus preparing an electrophotographic photosensitive member.

An Al made substrate having a diameter of 108 mm and a length of 358 mm was used as the substrate 106. The film formation was performed as follows: Namely, the Al made cylindrical substrate 106 was set on the substrate holder 105A, and the interior of the reaction chamber 100 was evacuated using the exhaust mechanism 107', to adjust the pressure within the reaction chamber at a pressure of 1×10$^{-6}$ Torr. The substrate 106 was rotated, and the heater 105A"

was energized to heat and keep the substrate 106 at a temperature of 250° C. A gas was then introduced from the raw gas supply system 108 in the reaction chamber by way of the gas supply pipe 117 and the gas discharge pipe 116 under the conditions shown in Table 7, and the pressure within the reaction chamber was adjusted at a pressure of 50 mTorr. Next, a high frequency was generated by the high frequency power supply 111, and a high frequency power was supplied to each cathode electrodes element as shown in Table 7. Thus, a photoreceptive layer composed of a charge injection inhabitation layer, a photoconductive layer and a surface protective layer was formed for a total period of time of about 30 min, thus preparing an electrophotographic photosensitive member. By repeating this film formation, five pieces of electrophotographic photosensitive members were prepared. Each of the photosensitive members was evaluated for the eletrostatic charging ability and the image density in the same manner in Experiment 1. As a result, it was revealed that each electrophotographic photosensitive member was excellent in the electrophotographic characteristics.

COMPARATIVE EXAMPLE 1

This comparative example was made using the apparatus shown in FIG. 1, which was provided with a single cathode electrode having a diameter of 208 mm and a length of 400 mm, in place of the apparatus shown in FIG. 9. The film formation was made in the same manner as in Example 1, except that a power of 800 W was changed from one portion upon formation of a charge injection inhabitation layer and a power of 1000 W was charged from one portion upon formation of a photoconductive layer, thus preparing five electrophotographic photosensitive members. Each of the photosensitive members was evaluated in the same manner as in Experiment 1. As a result, it was revealed that either of the electrophotographic photosensitive members caused the uneven electrostatic charging and the uneven image density to the extent not to be practically used.

EXAMPLE 2

Five pieces of electrophotographic photosensitive members were prepared in the same manner as in Example 1, except for using the apparatus shown in FIG. 10 in which the power supply to the cathode electrode elements 103A, 103B and 103C were performed from the two contact points in place of the apparatus shown in FIG. 9. Each of the photosensitive members was evaluated in the same manner as in Experiment 1. Each of the electrophotographic photosensitive members showed excellent result in any of the evaluation items, and therefore, it was excellent in the electrophotographic characteristics.

EXAMPLE 3

Five pieces of electrophotographic photosensitive members were prepared in the same manner in Example 2, except that the cylindrical substrate 106 was not rotated. Each of the photosensitive members was evaluated in the same manner in Experiment 1. Each of the electrophotographic photosensitive members showed excellent result in any of the evaluation items, and therefore, it was excellent in the electrophotographic characteristics.

EXAMPLE 4

Five pieces of electrophotographic photosensitive members were prepared using an apparatus shown in FIG. 18 in the same manner in Example 1. The apparatus shown in FIG. 18 is different from the apparatus shown in FIG. 9 in that the cathode electrode is divided into two elements 103A and 103B. Each of the cathode electrode elements 103A and 103B has a diameter of 208 mm and a length of 195 mm. Five pieces of electrophotographic photosensitive members were prepared in the same manner as in Example 1, except that the same power was supplied to the cathode electrode elements 103A and 103B (400 W: upon formation of charge injection inhabitation layer and surface protective layer; 500 W: upon formation of photoconductive layer). Each of the photosensitive members was evaluated in the same manner in Experiment 1. Each of the electrophotographic photosensitive members showed excellent result in any of the evaluation items, and therefore, it was excellent in the electrophotographic characteristics.

EXAMPLE 5

Five pieces of electrophotographic photosensitive members were prepared using an apparatus shown in FIG. 19 in the same manner as in Example 4. The apparatus shown in FIG. 19 is different from the apparatus shown in FIG. 18 in that a power is supplied to the cathode electrode elements 103A and 103B by way of specified paired power supply lines 118A, 118a and 118B, 118b, respectively. Moreover, in this apparatus, the contact points between the power supply lines and the cathode electrode elements are designed to be symmetric with each other relative to the substrate. Each of the photosensitive members was evaluated in the same manner as in Experiment 1. Each of the electrophotographic photosensitive members showed excellent result in any of the evaluation items, and therefore, it was excellent in the electrophotographic characteristics.

EXAMPLE 6

Five pieces of electrophotographic photosensitive members were prepared in the same manner as in Example 5, except that the cylindrical substrate 106 was not rotated. Each of the photosensitive members was evaluated in the same manner in Experiment 1. Each of the electrophotographic photosensitive members showed excellent results in any of the evaluation items, and therefore, it was excellent in the electrophotographic characteristics.

EXAMPLE 7

Electrophotographic photosensitive members were prepared using an apparatus shown in FIG. 20 in the same manner as in Example 1. The apparatus shown in FIG. 20 is different from the apparatus shown in FIG. 9 in that the cathode electrode is divided into four elements 103A, 103B, 103C and 103D each having a diameter of 208 mm and a length of 92.5 mm. Five pieces of electrophotographic photosensitive members were prepared in the same manner as in Example 1, except that the same power was supplied to the cathode electrode elements 103A, 103B, 103C and 103D (200 W: upon formation of charge injection inhabitation layer and surface protective layer; 250 W: upon formation of photoconductive layer). Each of the photosensitive members was evaluated in the same manner in Experiment 1. Each of the electrophotographic photosensitive members showed excellent result in any of the evaluation items, and therefore, it was excellent in the electrophotographic characteristics.

EXAMPLE 8

Electrophotographic photosensitive members were prepared using an apparatus shown in FIG. 21 in the same manner as in Example 7. The apparatus shown in FIG. 21 is different from the apparatus shown in FIG. 20 in that a power is supplied to the cathode electrode elements 103A, 103B, 103C and 103D by way of specified paired power supply lines 118A, 118a, 118B, 118b, 118C, 118c, and 118D, 118d, and the contact points between the power supply lines and the cathode electrode elements are positioned to be symmetric with each other relative to the substrate. Each of the photosensitive members was evaluated in the same manner in Experiment 1. Each of the electrophotographic photosensitive members showed excellent result in any of the evaluation items, and therefore, it was excellent in the electrophotographic characteristics.

EXAMPLE 9

Five pieces of electrophotographic photosensitive members were prepared in the same manner as in Example 8, except that the cylindrical substrate 106 was not rotated. Each of the photosensitive members was evaluated in the same manner in Experiment 1. Each of the electrophotographic photosensitive members showed excellent result in any of the evaluation items, and therefore, it was excellent in the electrophotographic characteristics.

TABLE 1

| surface protective layer | $SiH_4$ | 100 sccm |
|---|---|---|
| | $H_2$ | 100 sccm |
| | $CH_4$ | 500 sccm |
| | power applied | 800 W |
| | pressure in the reaction chamber | 50,500 mTorr |
| | film thickness | 1 μM |
| photo-conductive layer | $SiH_4$ | 500 sccm |
| | $H_2$ | 300 sccm |
| | power applied | 1000 W |
| | pressure in the reaction chamber | 50,500 mTorr |
| | film thickness | 25 μm |
| charge injection inhibition layer | $SiH_4$ | 500 sccm |
| | $H_2$ | 300 sccm |
| | NO | 10 sccm |
| | $B_2H_6$ | 2000 ppm |
| | power applied | 800 W |
| | pressure in the reaction chamber | 50,500 mTorr |
| | film thickness | 1 μm |

TABLE 2

| | Sample No. | | | | | | | | | |
|---|---|---|---|---|---|---|---|---|---|---|
| | 1a | 2a,2b | 3a,3b | 4a,4b | 5a,5b | 6a,6b | 7a,7b | 8a,8b | 9a,9b | 10a |
| frequency (MHz) | 13.56 | 13.56 | 40.0 | 60.0 | 100.0 | 150.0 | 200.0 | 250.0 | 300.0 | 350.0 |
| pressure in the reaction chamber (mtorr) | 50 | 500 | 50 | 50 | 50 | 50 | 50 | 50 | 50 | 50 |

※a sample No. accompanied with a: a case in which the substrate is rotated
a sample No. accompanied with b: a case in which the substrate is not rotated

TABLE 3

| | Sample No. | | | | | | | |
|---|---|---|---|---|---|---|---|---|
| | 2a | 3a | 4a | 5a | 6a | 7a | 8a | 9a |
| power source frequency (MHz) | 13.56 | 40.0 | 60.0 | 100.0 | 150.0 | 200.0 | 250.0 | 300.0 |
| film thickness distribution variation in the longitudinal axis direction (%) | 14 | 18 | 28 | 35 | 38 | 40 | 45 | 53 |
| film thickness distribution variation in the circumferential direction (%) | 2 | 3 | 2 | 3 | 3 | 2 | 3 | 2 |
| charge retentivity | ○ | Δ | Δ | x | x | x | x | x |
| image density | ○ | ○ | Δ | x | x | x | x | x |
| film deposition rate (μm/h) | 11 | 25 | — | — | — | — | — | — |

| | Sample No. | | | | | | | |
|---|---|---|---|---|---|---|---|---|
| | 2b | 3b | 4b | 5b | 6b | 7b | 8b | 9b |
| power source frequency (MHz) | 13.56 | 40.0 | 60.0 | 100.0 | 150.0 | 200.0 | 250.0 | 300.0 |
| film thickness distribution variation in the longitudinal axis direction (%) | 13 | 18 | 28 | 33 | 39 | 41 | 46 | 55 |
| film thickness distribution variation in the circumferential direction (%) | 4 | 5 | 18 | 25 | 31 | 35 | 41 | 45 |
| charge retentivity | Δ | Δ | x | x | x | x | x | x |
| image density | Δ | Δ | x | x | x | x | x | x |
| film deposition rate (μm/h) | 10 | 23 | — | — | — | — | — | — |

※a sample No. accompanied with a is a case in which the substrate is rotated.
a sample No. accompanied with b is a case in which the substrate is not rotated.
—: a case in which the value of the film thickness distribution variation was so large that the film deposition rate could not be figured out.

TABLE 4

| | Sample No. | | | | | | | |
|---|---|---|---|---|---|---|---|---|
| | 12a | 13a | 14a | 15a | 16a | 17a | 18a | 19a |
| power source frequency (MHz) | 13.56 | 40.0 | 60.0 | 100.0 | 150.0 | 200.0 | 250.0 | 300.0 |
| film thickness distribution variation in the longitudinal axis direction (%) | 12 | 18 | 26 | 31 | 34 | 36 | 40 | 47 |
| film thickness distribution variation in the circumferential direction (%) | 2 | 2 | 3 | 2 | 1 | 2 | 2 | 3 |
| charge retentivity | o | Δ | Δ | x | x | x | x | x |
| image density | o | o | Δ | x | x | x | x | x |
| film deposition rate (μm/h) | 10 | 26 | — | — | — | — | — | — |

TABLE 4-continued

| | Sample No. | | | | | | | |
|---|---|---|---|---|---|---|---|---|
| | 12b | 13b | 14b | 15b | 16b | 17b | 18b | 19b |
| power source frequency (MHz) | 13.56 | 40.0 | 60.0 | 100.0 | 150.0 | 200.0 | 250.0 | 300.0 |
| film thickness distribution variation in the longitudinal axis direction (%) | 11 | 17 | 24 | 30 | 35 | 37 | 42 | 47 |
| film thickness distribution variation in the circumferential direction (%) | 3 | 3 | 2 | 2 | 2 | 3 | 3 | 2 |
| charge retentivity | Δ | o | Δ | x | x | x | x | x |
| image density | o | o | Δ | x | x | x | x | x |
| film deposition rate (μm/h) | 10 | 23 | — | — | — | — | — | — |

※ a sample No. accompanied with a is a case in which the substrate is rotated.
a sample No. accompanied with b is a case in which the substrate is not rotated.
—: a case in which the value of the film thickness distribution variation was so large that the film deposition rate could not be figured out.

TABLE 5

| | Sample No. | | | | | | | | |
|---|---|---|---|---|---|---|---|---|---|
| | 22a | 23a | 24a | 25a | 26a | 27a | 28a | 29a | 30a |
| power source frequency (MHz) | 13.56 | 40.0 | 60.0 | 100.0 | 150.0 | 200.0 | 250.0 | 300.0 | 350.0 |
| film thickness distribution variation in the longitudinal axis direction (%) | 9 | 8 | 8 | 6 | 9 | 9 | 12 | 13 | 17 |
| film thickness distribution variation in the circumferential direction (%) | 2 | 1 | 2 | 2 | 1 | 2 | 3 | 4 | 6 |
| charge retentivity | ⊙ | ⊙ | ⊙ | ⊙ | ⊙ | ⊙ | o | Δ | x |
| image density | ⊙ | ⊙ | ⊙ | ⊙ | ⊙ | ⊙ | o | Δ | x |
| film deposition rate (μm/h) | 12 | 24 | 41 | 56 | 73 | 82 | 74 | 70 | 65 |

| | Sample No. | | | | | | | | |
|---|---|---|---|---|---|---|---|---|---|
| | 22b | 23b | 24b | 25b | 26b | 27b | 28b | 29b | 30b |
| power source frequency (MHz) | 13.56 | 40.0 | 60.0 | 100.0 | 150.0 | 200.0 | 250.0 | 300.0 | 350.0 |
| film thickness distribution variation in the longitudinal axis direction (%) | 9 | 9 | 7 | 7 | 8 | 9 | 12 | 14 | 18 |
| film thickness distribution variation in the circumferential direction (%) | 4 | 6 | 15 | 26 | 30 | 34 | 43 | 48 | 52 |
| charge retentivity | o | o | Δ | x | x | x | x | x | x |

TABLE 5-continued

| image density | o | o | Δ | x | x | x | x | x | x |
|---|---|---|---|---|---|---|---|---|---|
| film deposition rate (μm/h) | 11 | 23 | 41 | — | — | — | — | — | — |

※a sample No. accompanied with a is a case in which the substrate is rotated.
a sample No. accompanied with b is a case in which the substrate is not rotated.
—: a case in which the value of the film thickness distribution variation was so large that the film deposition rate could not be figured out.

TABLE 6

| | Sample No. | | | | | | | | |
|---|---|---|---|---|---|---|---|---|---|
| | 32a | 33a | 34a | 35a | 36a | 37a | 38a | 39a | 40a |
| power source frequency (MHz) | 13.56 | 40.0 | 60.0 | 100.0 | 150.0 | 200.0 | 250.0 | 300.0 | 350.0 |
| film thickness distribution variation in the longitudinal axis direction (%) | 8 | 6 | 6 | 5 | 8 | 8 | 9 | 10 | 13 |
| film thickness distribution variation in the circumferential direction (%) | 1 | 1 | 1 | 1 | 2 | 1 | 2 | 2 | 2 |
| charge retentivity | ⊙ | ⊙ | ⊙ | ⊙ | ⊙ | ⊙ | ⊙ | o | Δ |
| image density | ⊙ | ⊙ | ⊙ | ⊙ | ⊙ | ⊙ | ⊙ | o | Δ |
| film deposition rate (μm/h) | 11 | 25 | 39 | 58 | 74 | 83 | 72 | 69 | 67 |

| | Sample No. | | | | | | | | |
|---|---|---|---|---|---|---|---|---|---|
| | 32b | 33b | 34b | 35b | 36b | 37b | 38b | 39b | 40b |
| power source frequency (MHz) | 13.56 | 40.0 | 60.0 | 100.0 | 150.0 | 200.0 | 250.0 | 300.0 | 350.0 |
| film thickness distribution variation in the longitudinal axis direction (%) | 7 | 8 | 6 | 5 | 6 | 6 | 8 | 12 | 15 |
| film thickness distribution variation in the circumferential direction (%) | 2 | 2 | 2 | 1 | 2 | 2 | 3 | 2 | 2 |
| charge retentivity | ⊙ | ⊙ | ⊙ | ⊙ | ⊙ | ⊙ | ⊙ | o | Δ |
| image density | ⊙ | ⊙ | ⊙ | ⊙ | ⊙ | ⊙ | ⊙ | o | Δ |
| film deposition rate (μm/h) | 11 | 23 | 40 | 59 | 72 | 82 | 72 | 70 | 68 |

※a sample No. accompanied with a is a case in which the substrate is rotated.
a sample No. accompanied with b is a case in which the substrate is not rotated.

TABLE 7

| surface protective layer | $SiH_4$ | 100 sccm |
|---|---|---|
| | $H_2$ | 100 sccm |
| | $CH_4$ | 500 sccm |
| | power applied | |
| | cathode 103A | 160 W |
| | cathode 103B | 480 W |
| | cathode 103C | 160 W |
| | pressure in the reaction chamber | 50 mTorr |
| | film thickness | 1 μm |

TABLE 7-continued

| photo-conductive layer | $SiH_4$ | 500 sccm |
|---|---|---|
| | $H_2$ | 300 sccm |
| | power applied | |
| | cathode 103A | 200 W |
| | cathode 103B | 600 W |
| | cathode 103C | 200 W |
| | pressure in the reaction chamber | 50 mTorr |
| | film thickness | 25 μm |
| charge injection | $SiH_4$ | 500 sccm |

TABLE 7-continued

| inhibition layer | H₂ | 300 sccm |
| --- | --- | --- |
| | NO | 10 sccm |
| | B₂H₆ | 2000 ppm |
| power applied | | |
| | cathode 103A | 160 W |
| | cathode 103B | 480 W |
| | cathode 103C | 160 W |
| | pressure in the reaction chamber | 50 mTorr |
| | film thickness | 1 μm |

Figure 1:
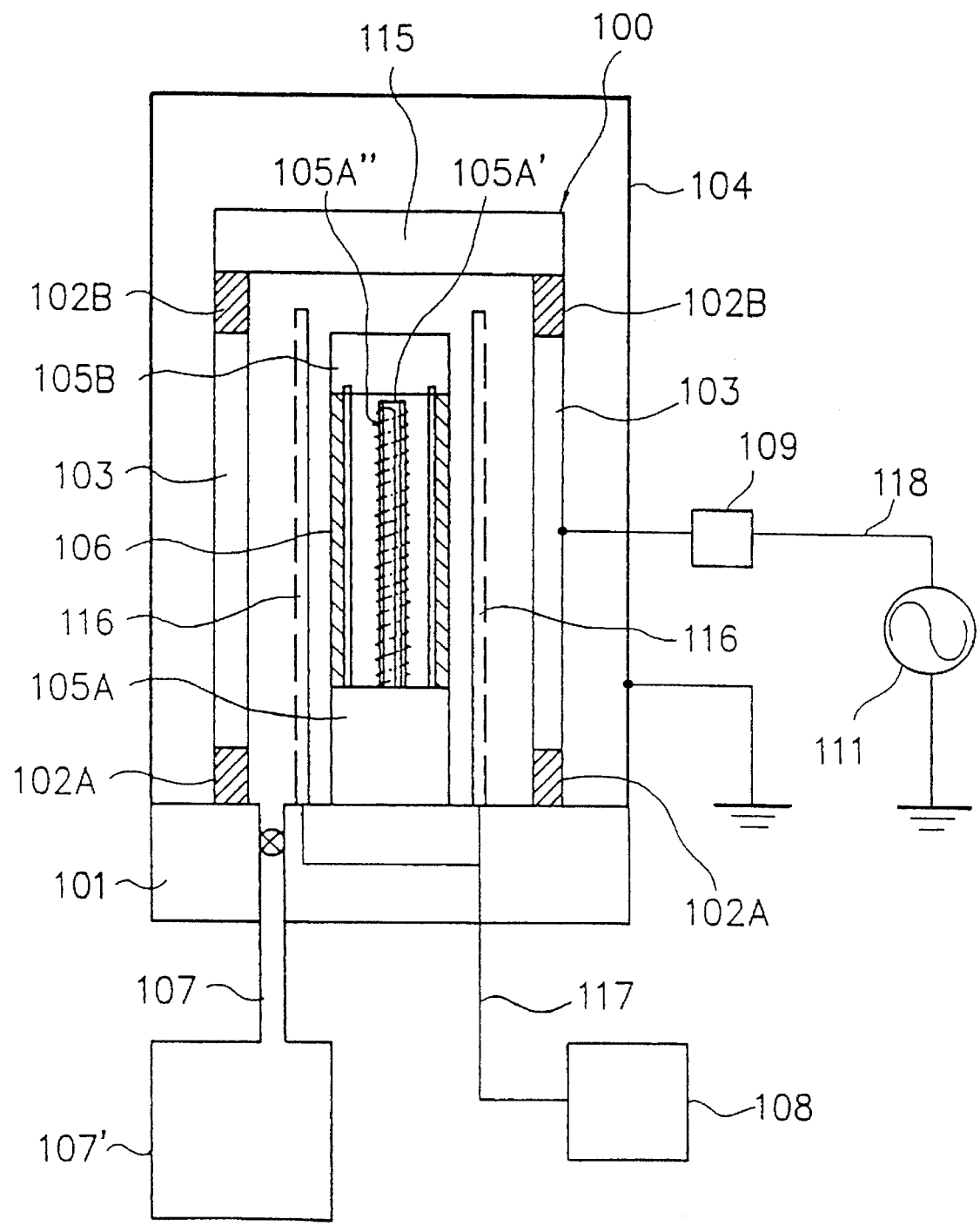
FIG. 1 is a typical view showing a prior art plasma CVD apparatus.
Figure 2:
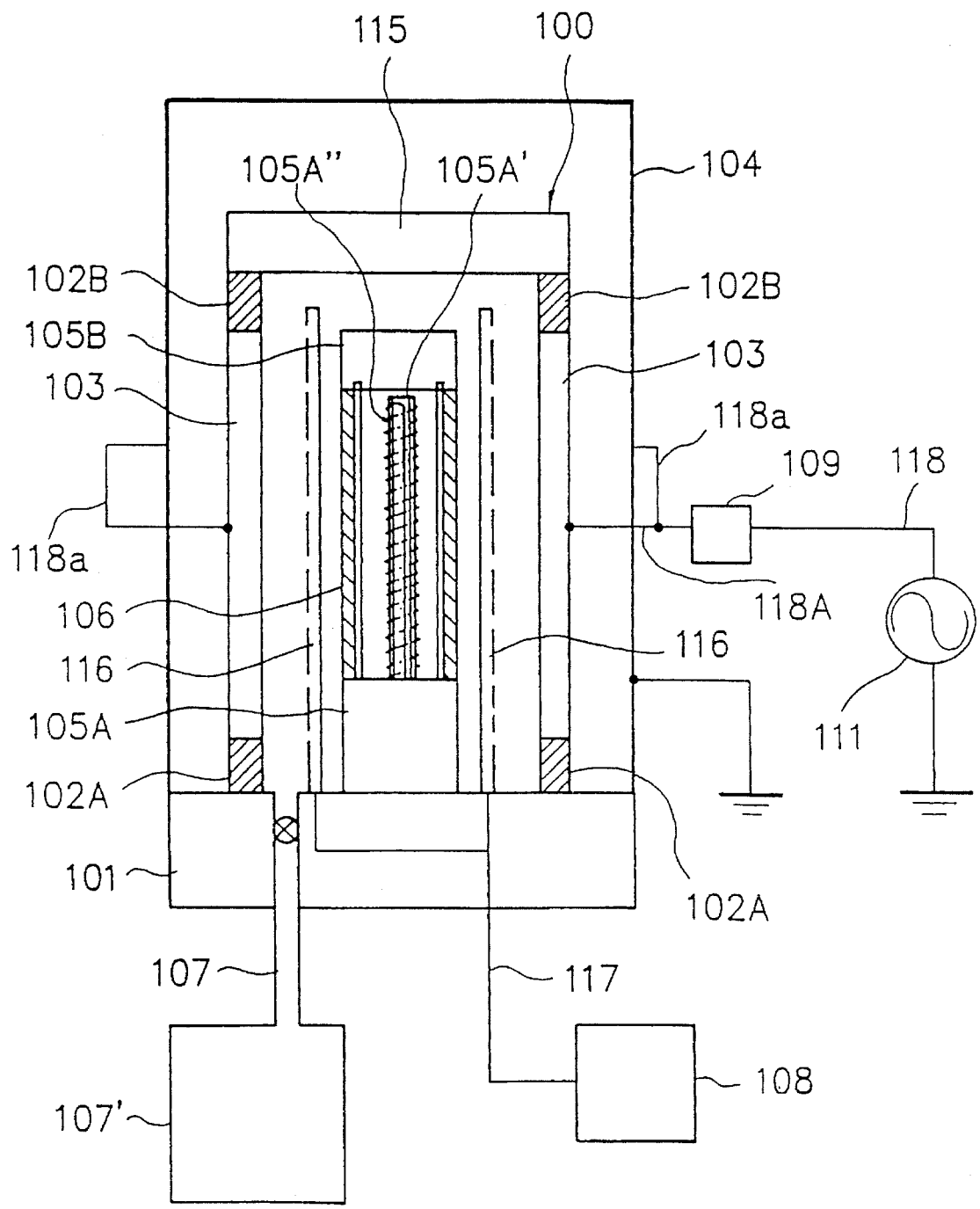
FIG. 2 is a typical view of a plasma CVD apparatus partially modified from the apparatus shown in FIG. 1 for experiment.
Figure 3:
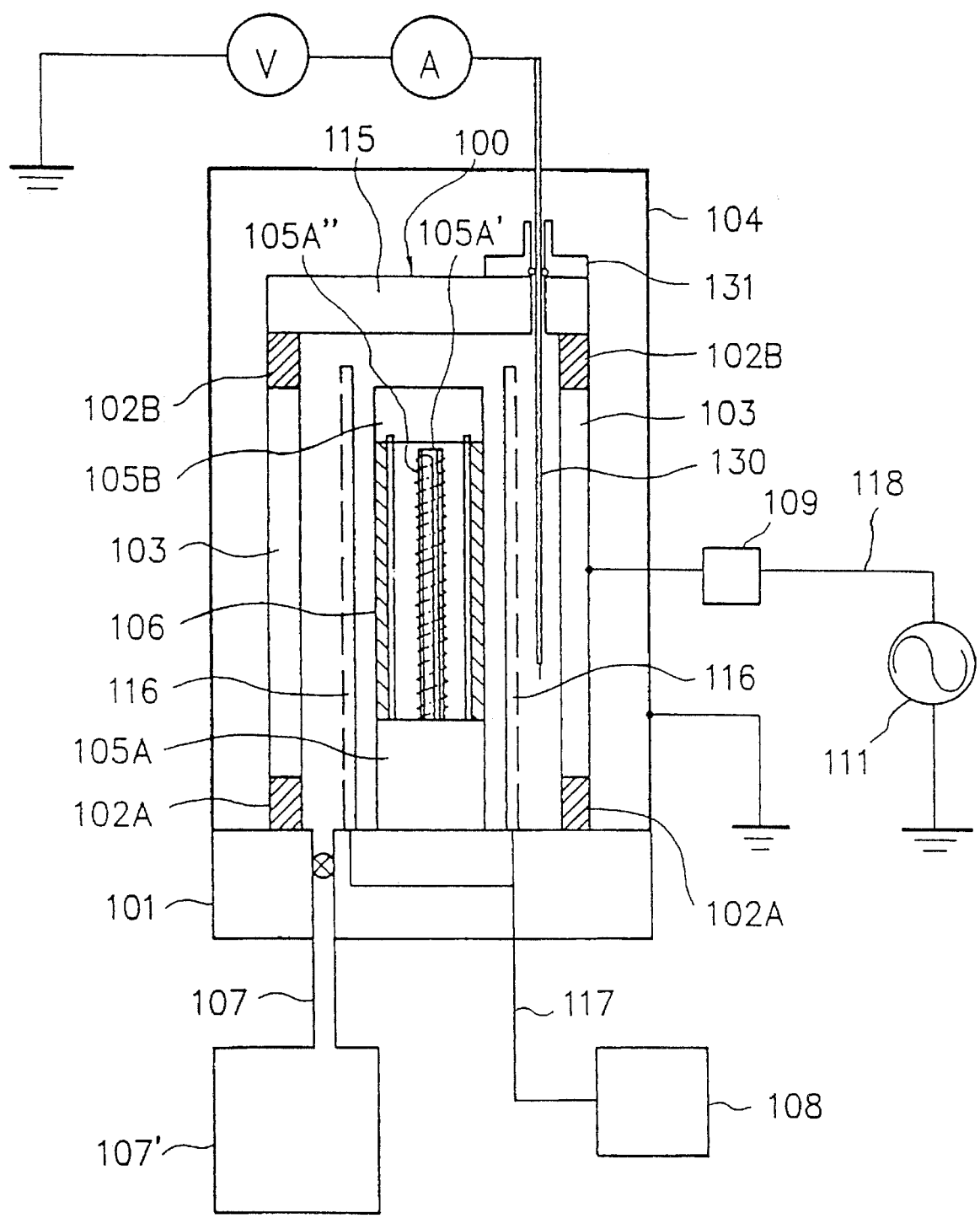
FIG. 3 is a typical view of a plasma CVD apparatus partially modified from the apparatus shown in FIG. 1 for experiment.
Figure 4:
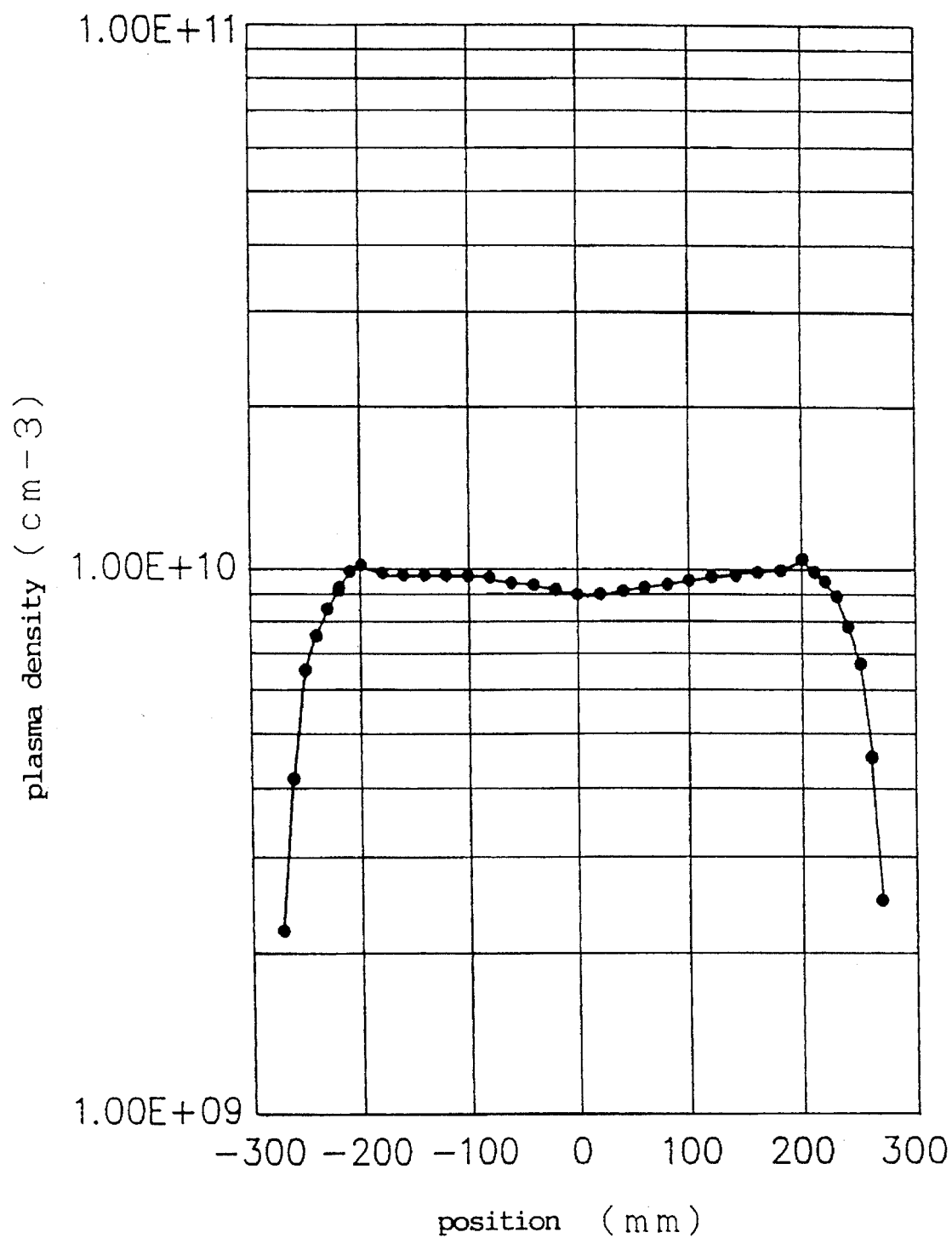
FIG. 4 is a graph showing the relationship between the plasma density and the position of a cylindrical substrate in the case of using a power with a frequency of 40 MHz in the prior art plasma CVD apparatus.
Figure 5:
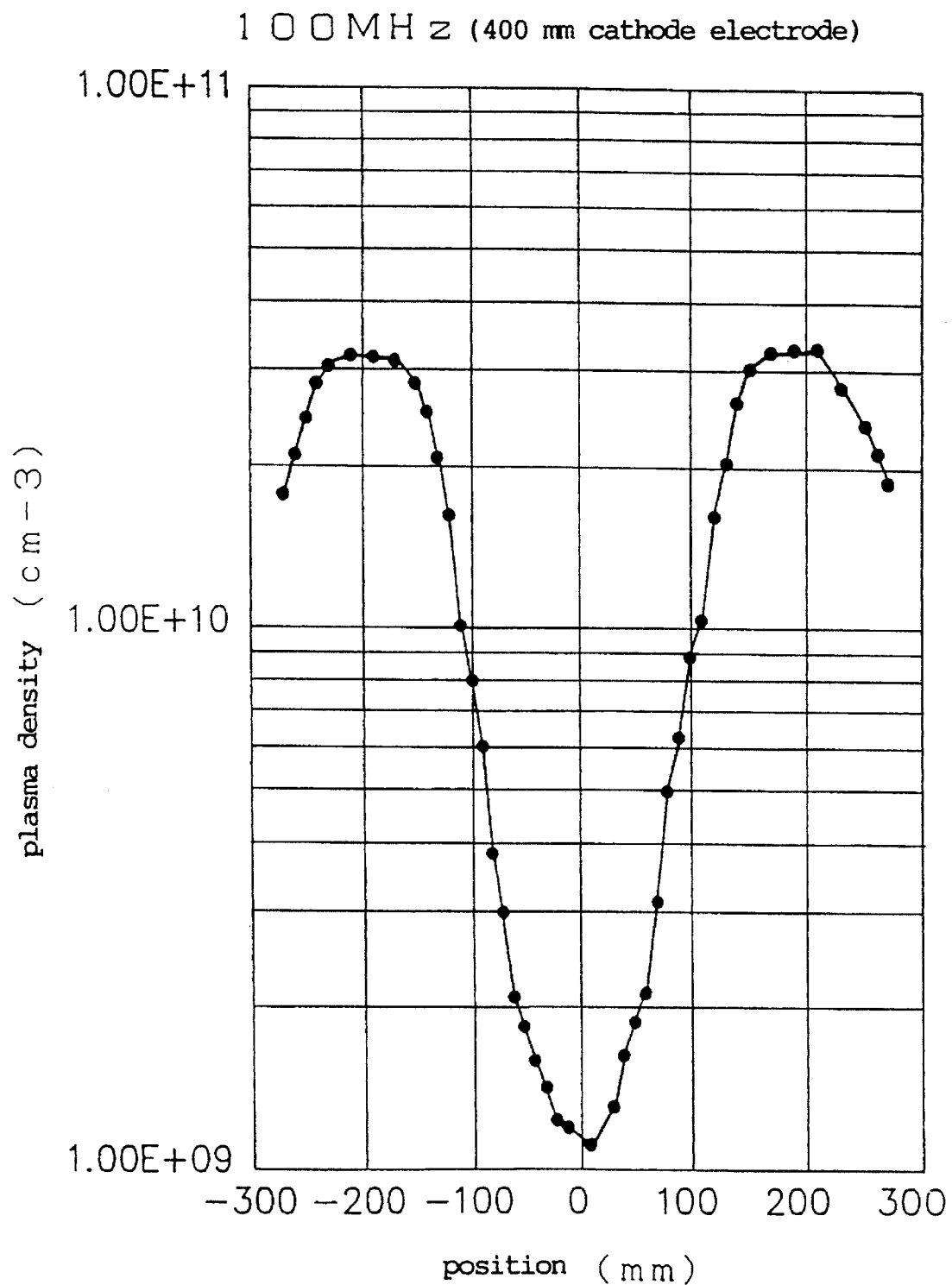
FIG. 5 is a graph showing the relationship between the plasma density and the position of a cylindrical substrate in the case of using a power with a frequency of 100 MHz in the prior art plasma CVD apparatus.
Figure 6:
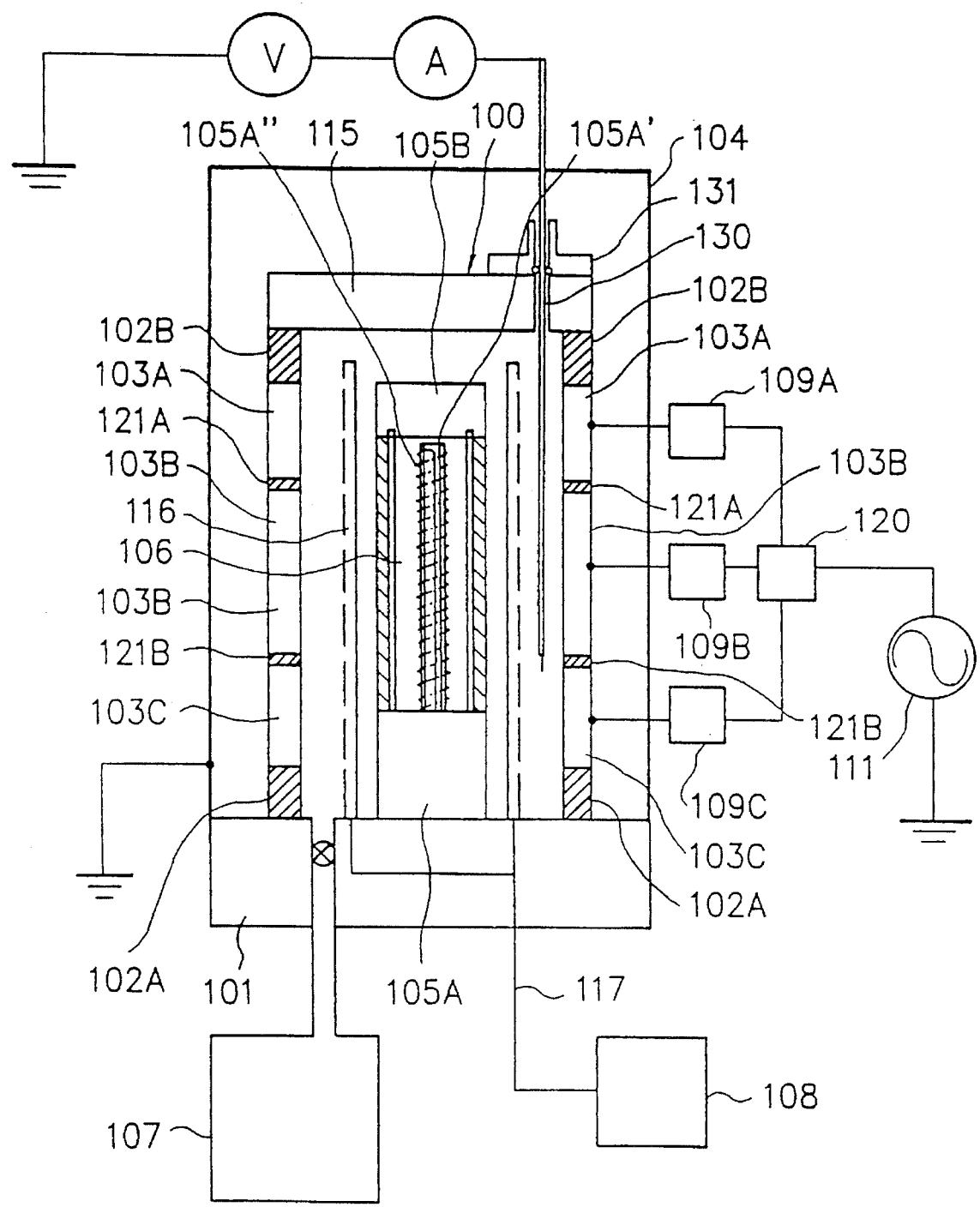
FIG. 6 is a typical view showing a plasma CVD apparatus (on an experimental scale) of the present invention.
Figure 7:
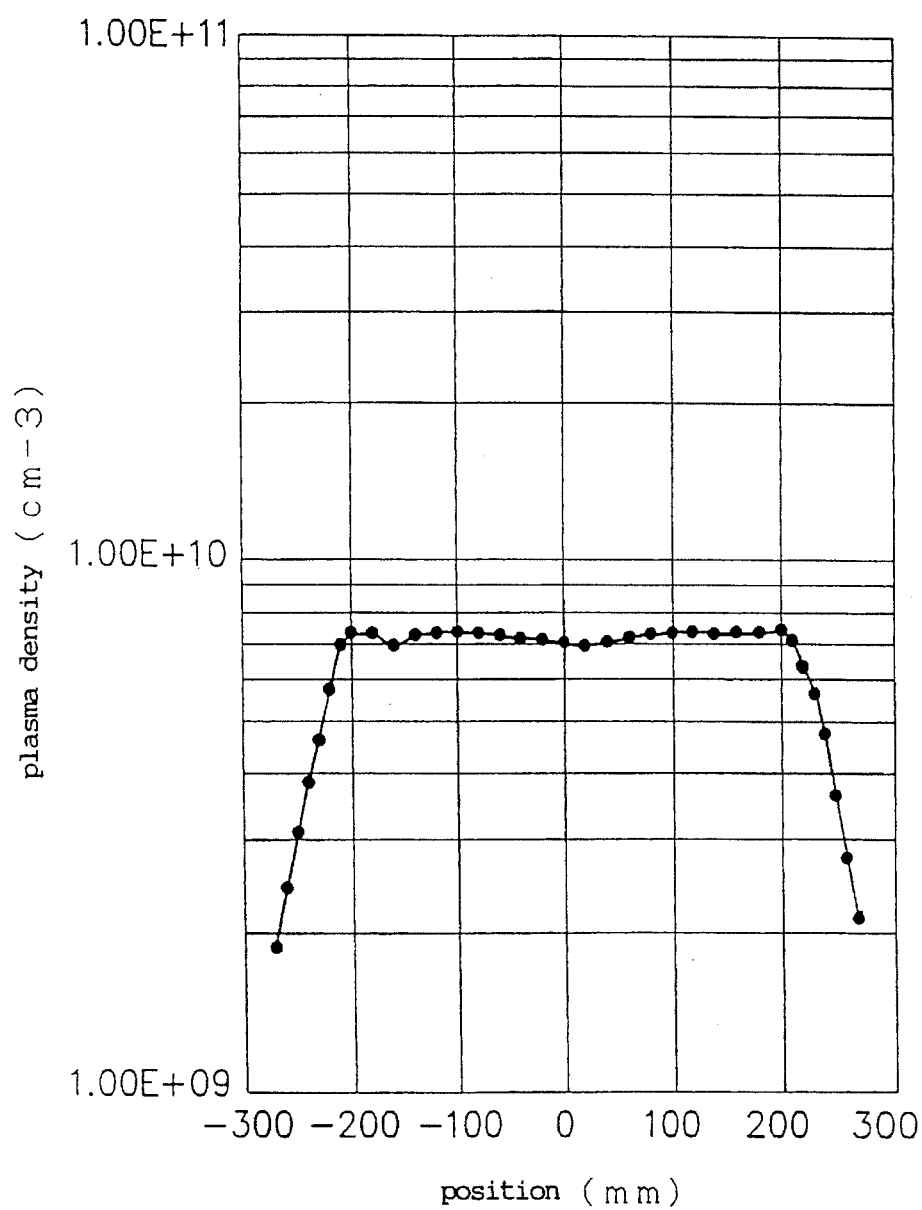
FIG. 7 is a graph showing the relationship between the plasma density and the position of a cylindrical substrate in the case of using a power with a frequency of 40 MHz in the plasma CVD apparatus shown in FIG. 6.
Figure 8:
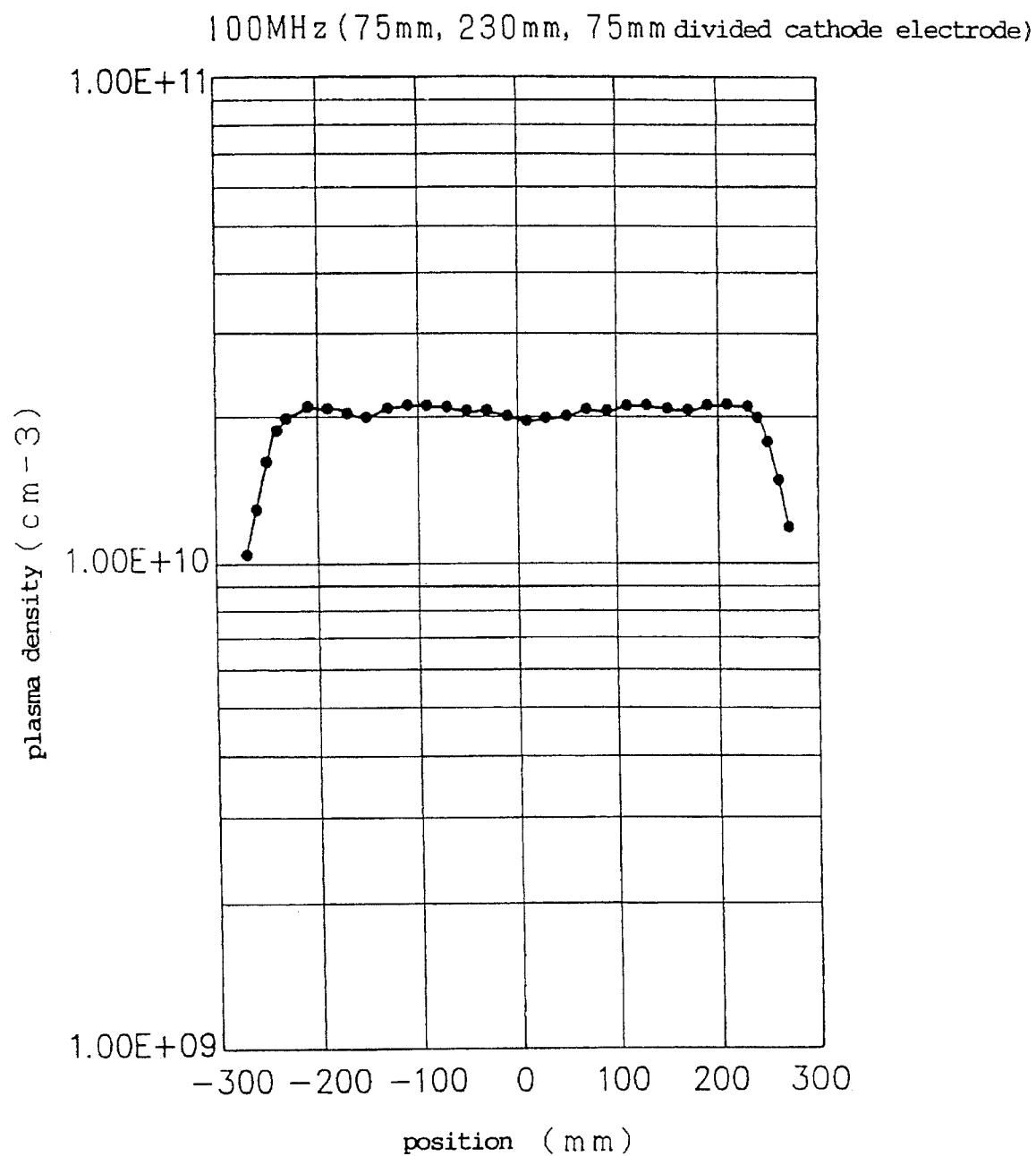
FIG. 8 is a graph showing the relationship between the plasma density and the position of a cylindrical substrate in the case of using a power with a frequency of 100 MHz in the plasma CVD apparatus shown in FIG. 6.
Figure 9:
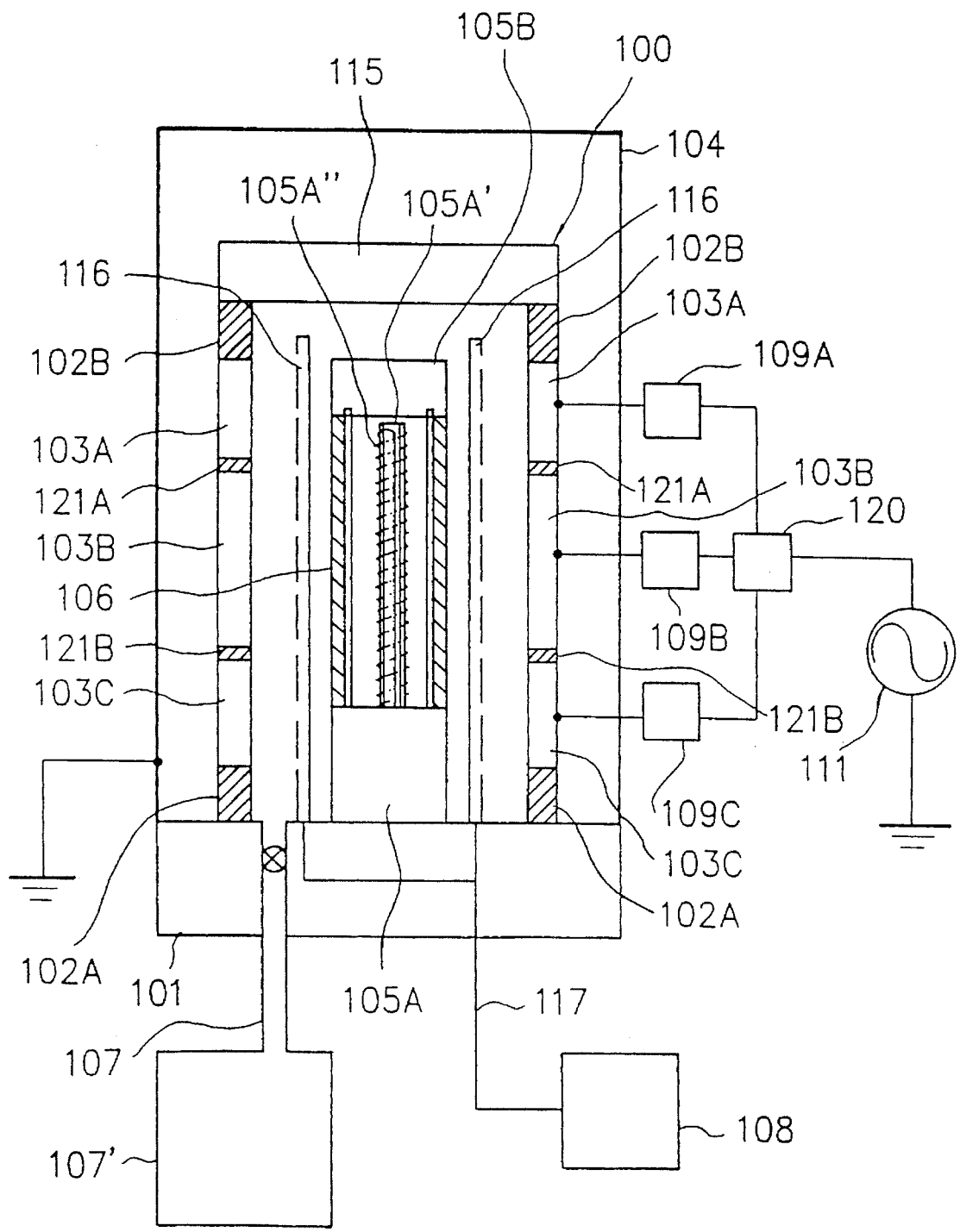
FIG. 9 is a typical view showing one example of a plasma CVD apparatus of the present invention.
Figure 10:
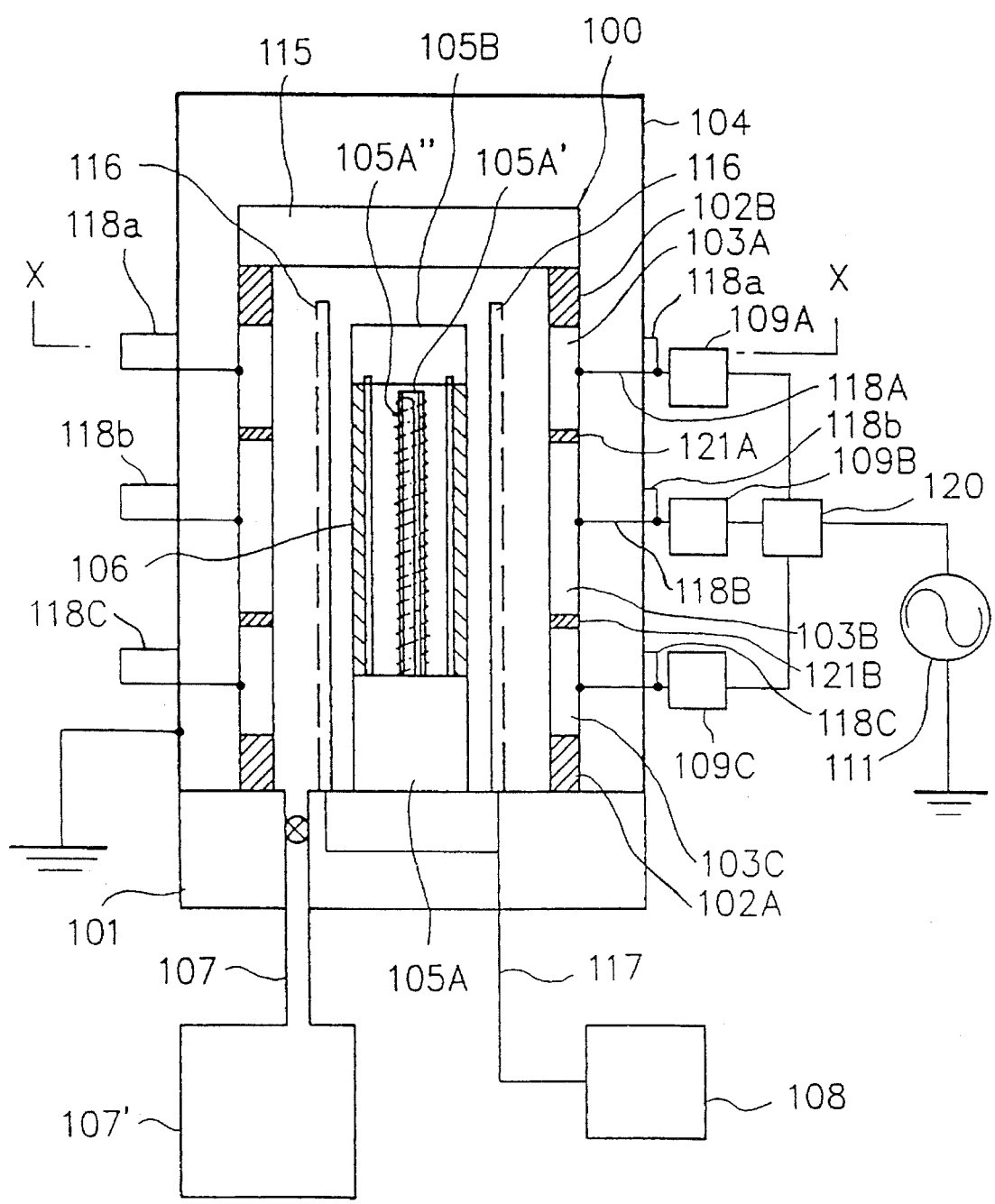
FIG. 10 is a typical view showing one example of a plasma CVD apparatus of the present invention.
Figure 11:
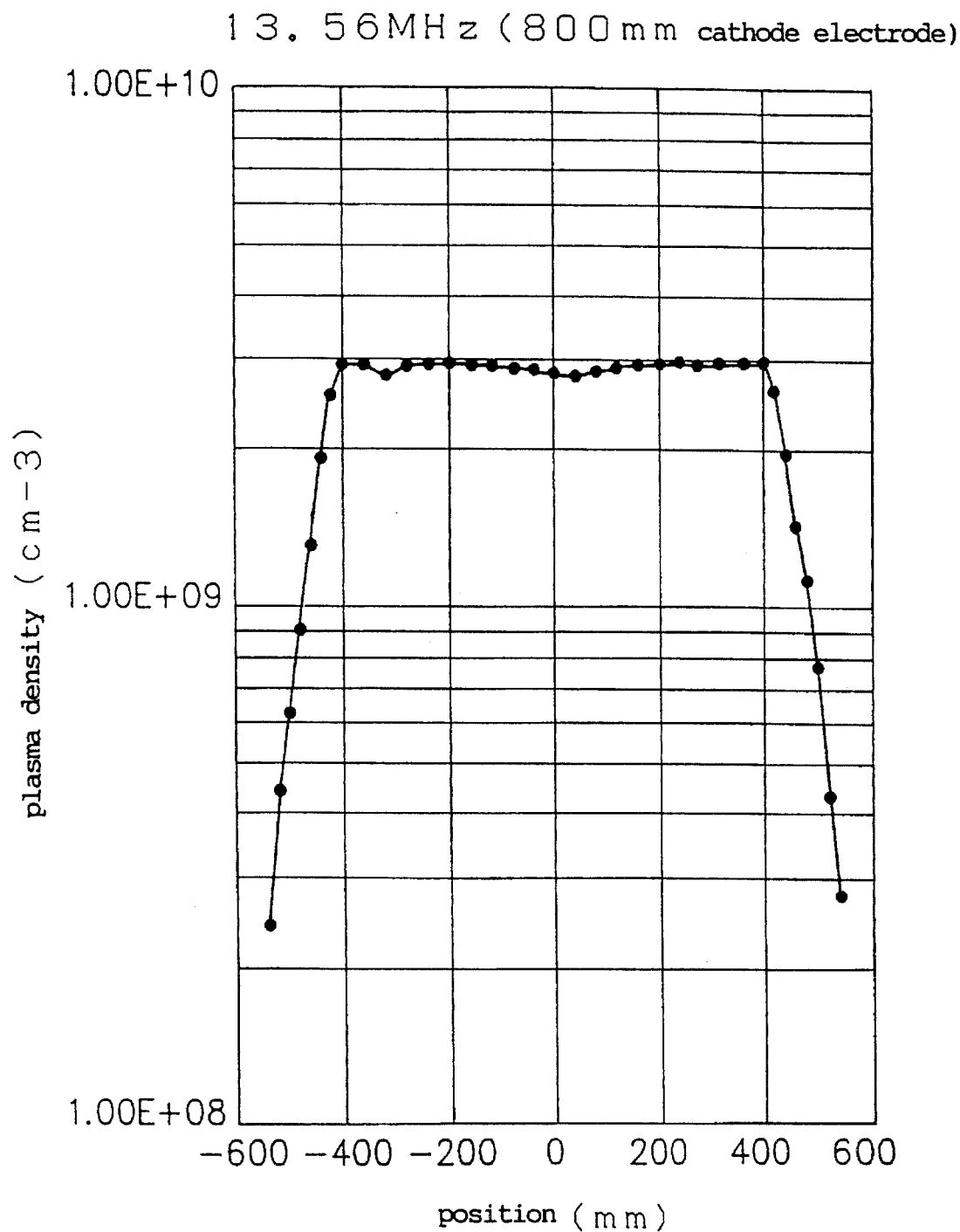
FIG. 11 is a graph showing the relationship between the plasma density and the position of a cylindrical substrate in the case of using a power with a frequency of 13.56 MHz in a plasma CVD apparatus partially modified from the apparatus shown in FIG. 1.
Figure 12:
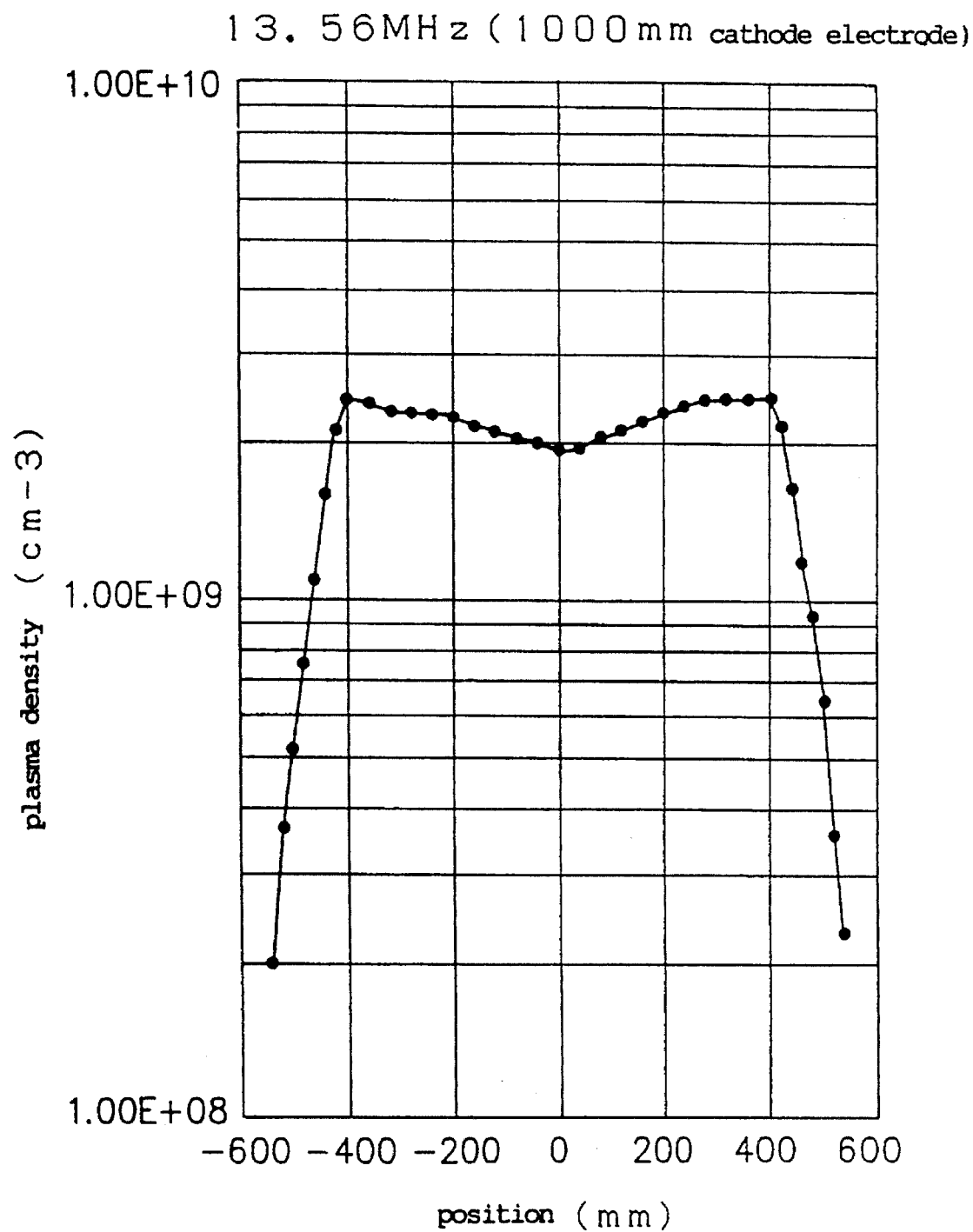
FIG. 12 is a graph of plotting the plasma density within a plasma CVD apparatus relative to the position of a cylindrical substrate.
Figure 13:
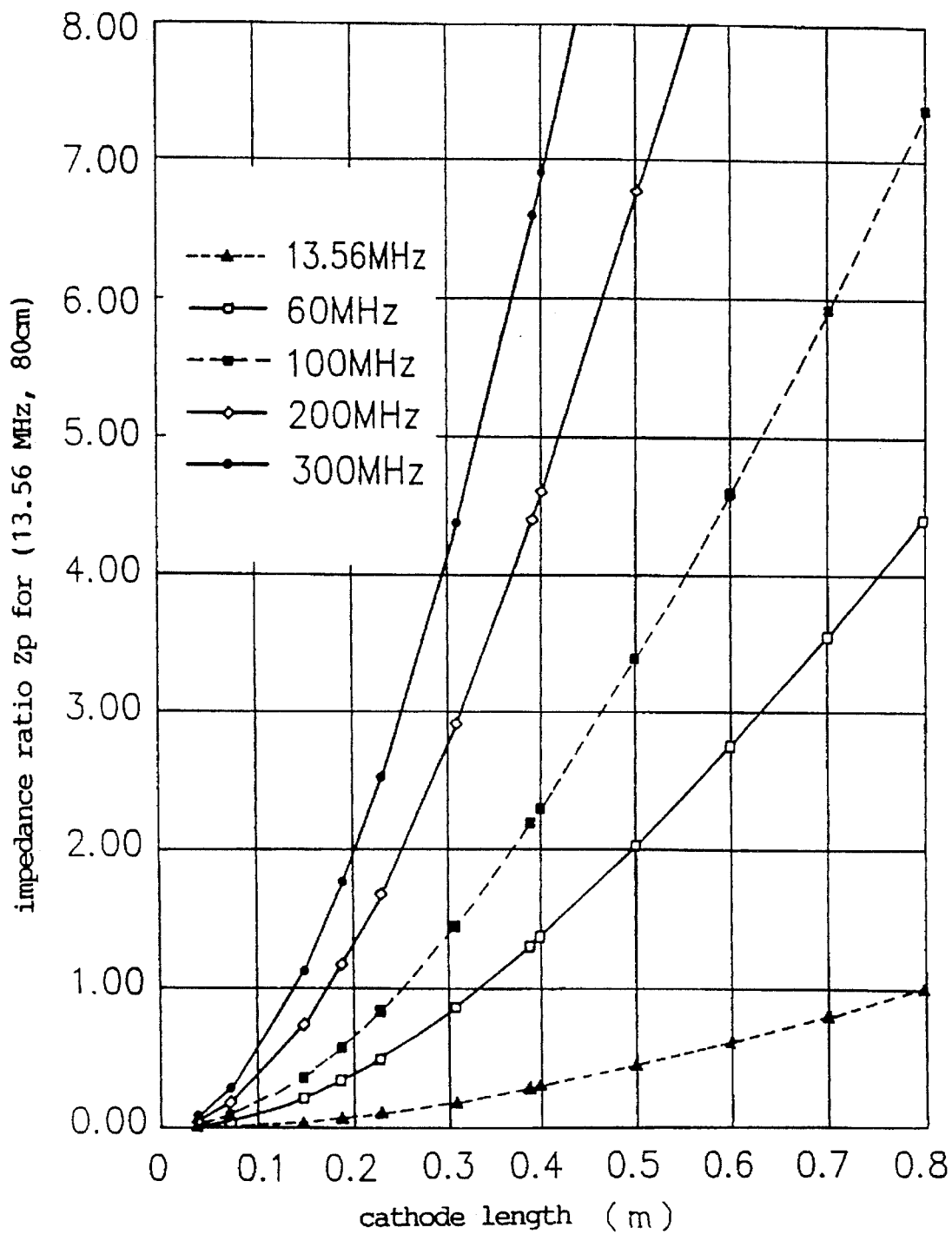
FIG. 13 is a graph showing the relationship between the length of a cathode electrode and an impedance in the case of a high frequency power supply with each frequency.
Figure 14:
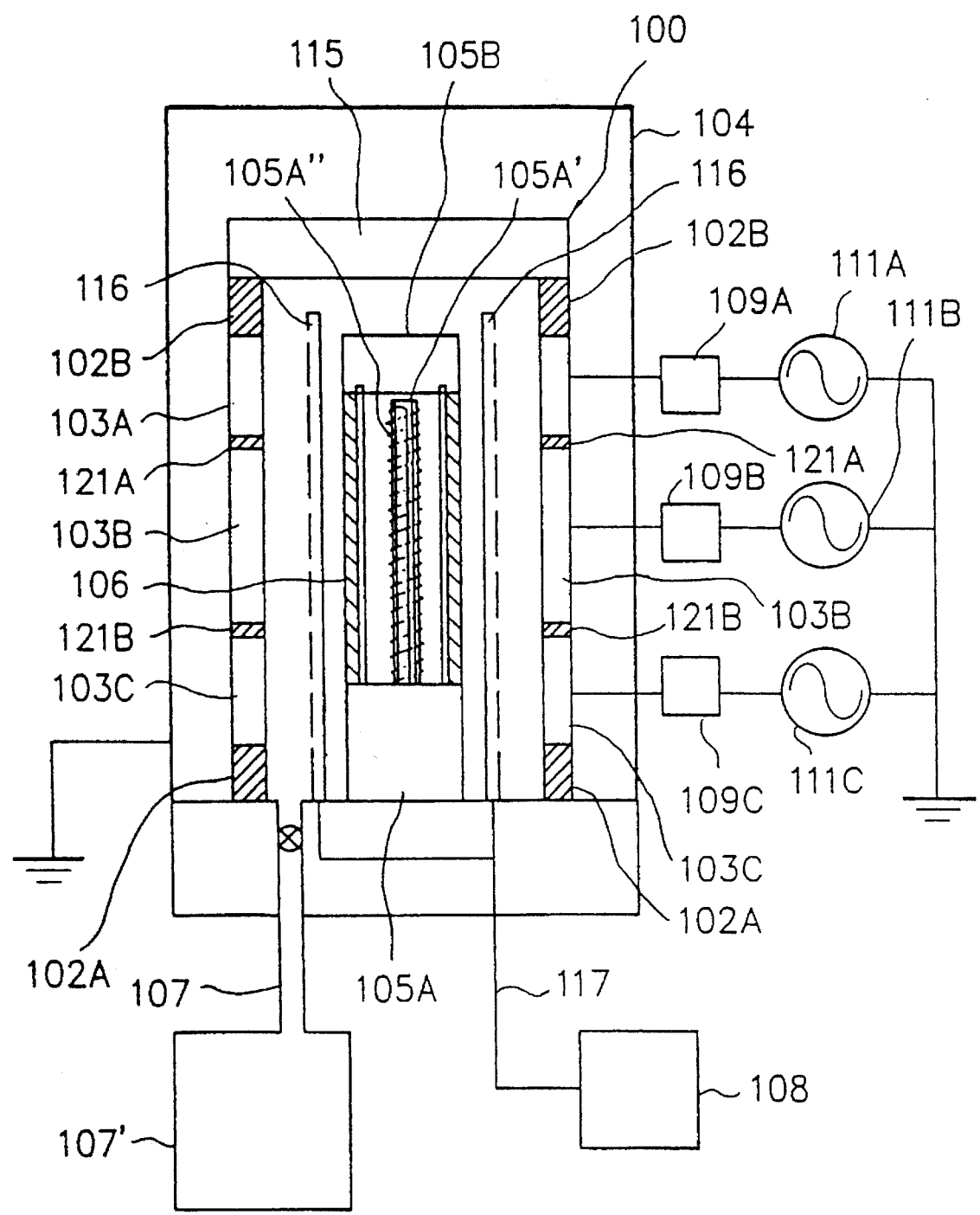
FIG. 14 is a typical view showing one example of a plasma CVD apparatus of the present invention.
Figure 15:
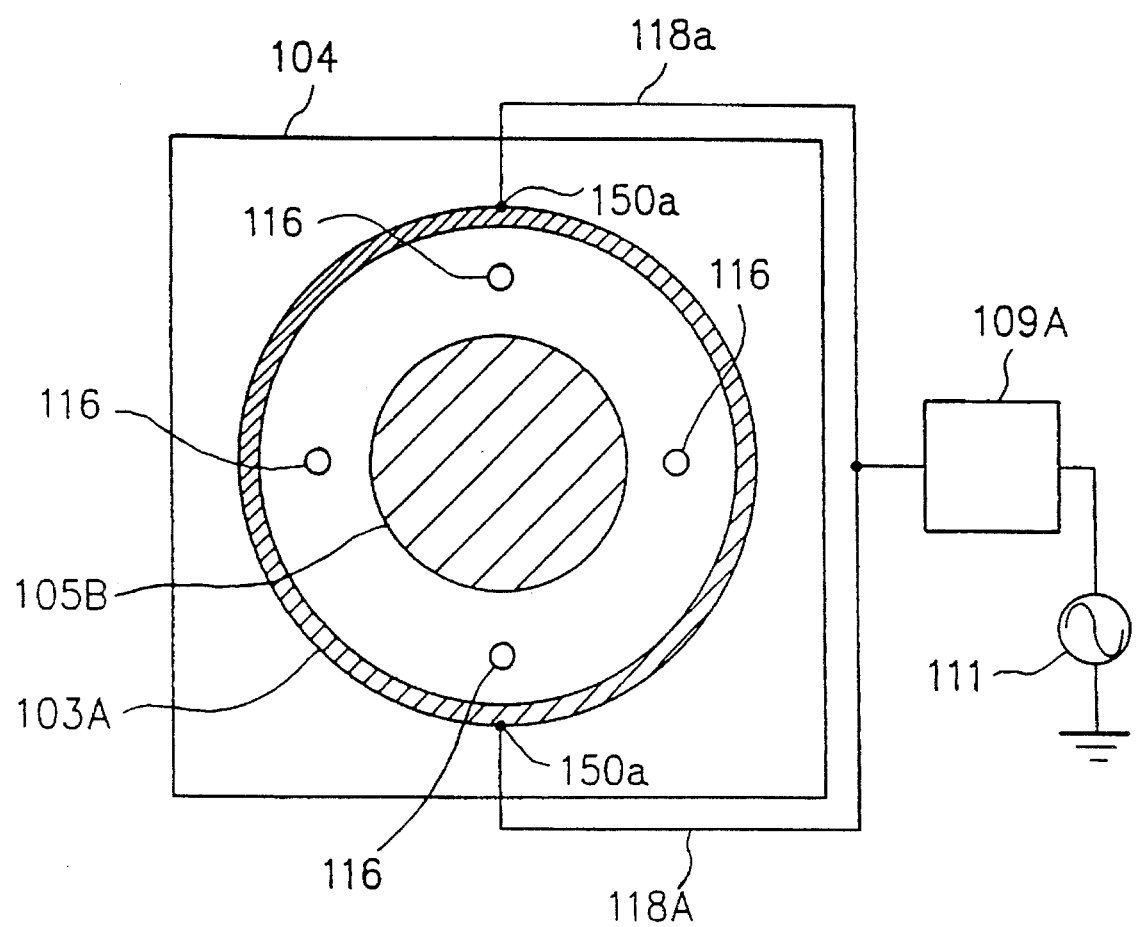
FIG. 15 is a typical view showing one example of a plasma CVD apparatus of the present invention.
Figure 16:
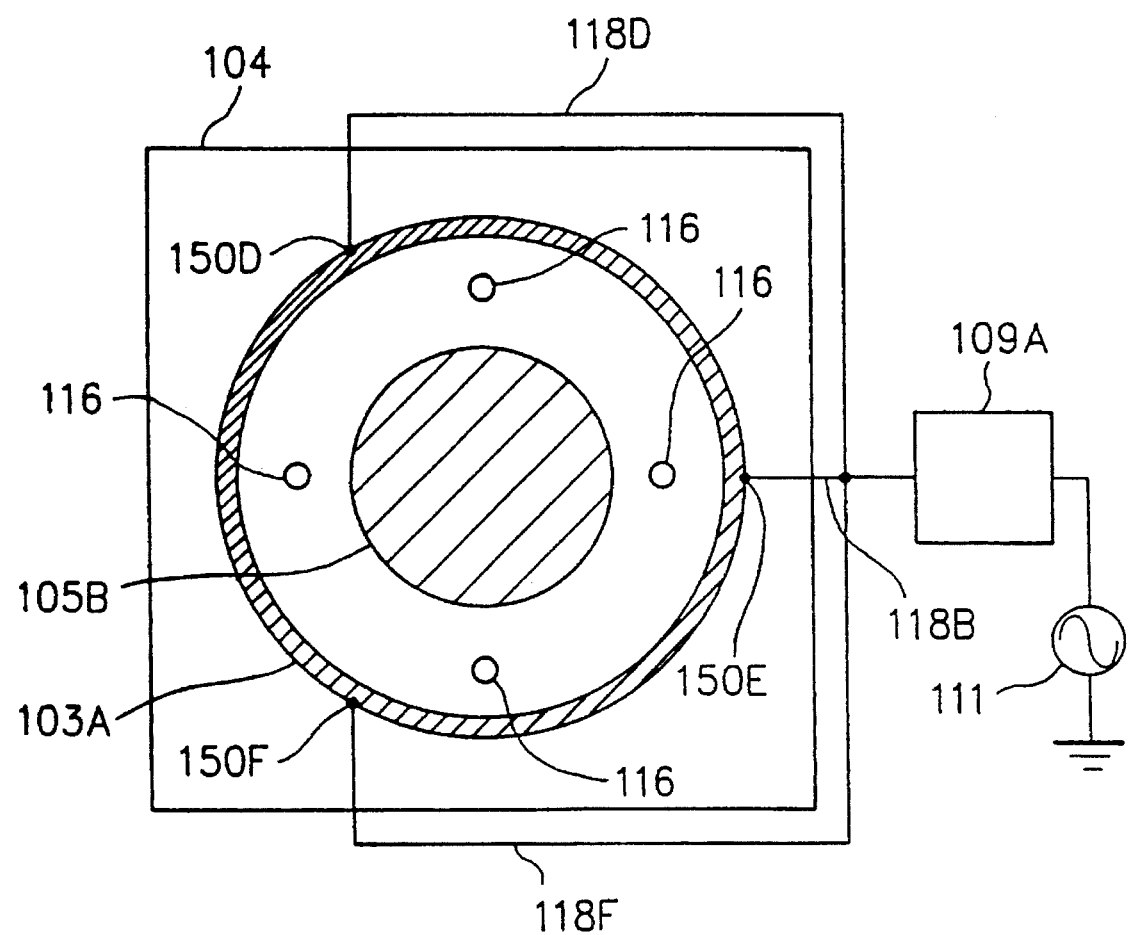
FIG. 16 is a typical view showing one example of a plasma CVD apparatus of the present invention.
Figure 17:
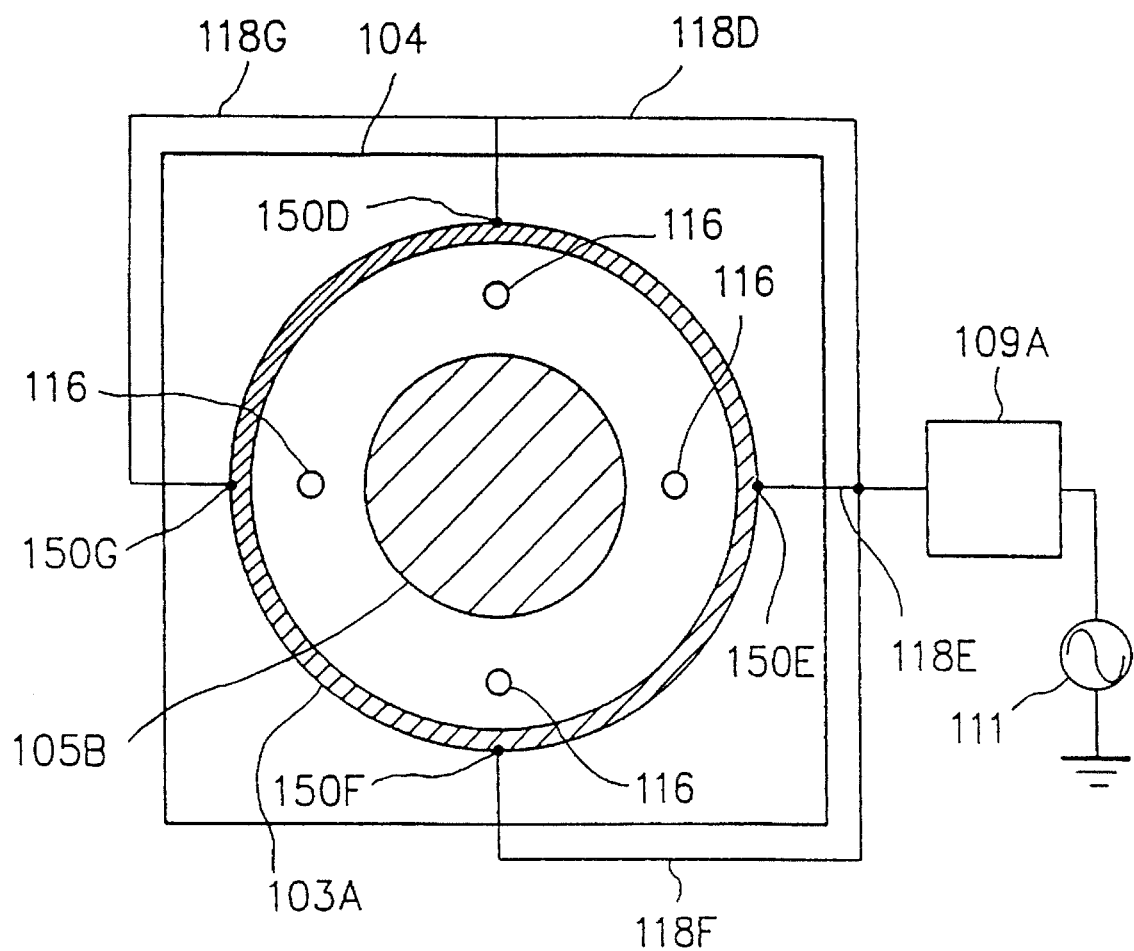
FIG. 17 is a typical view showing one example of a plasma CVD apparatus of the present invention.
Figure 18:
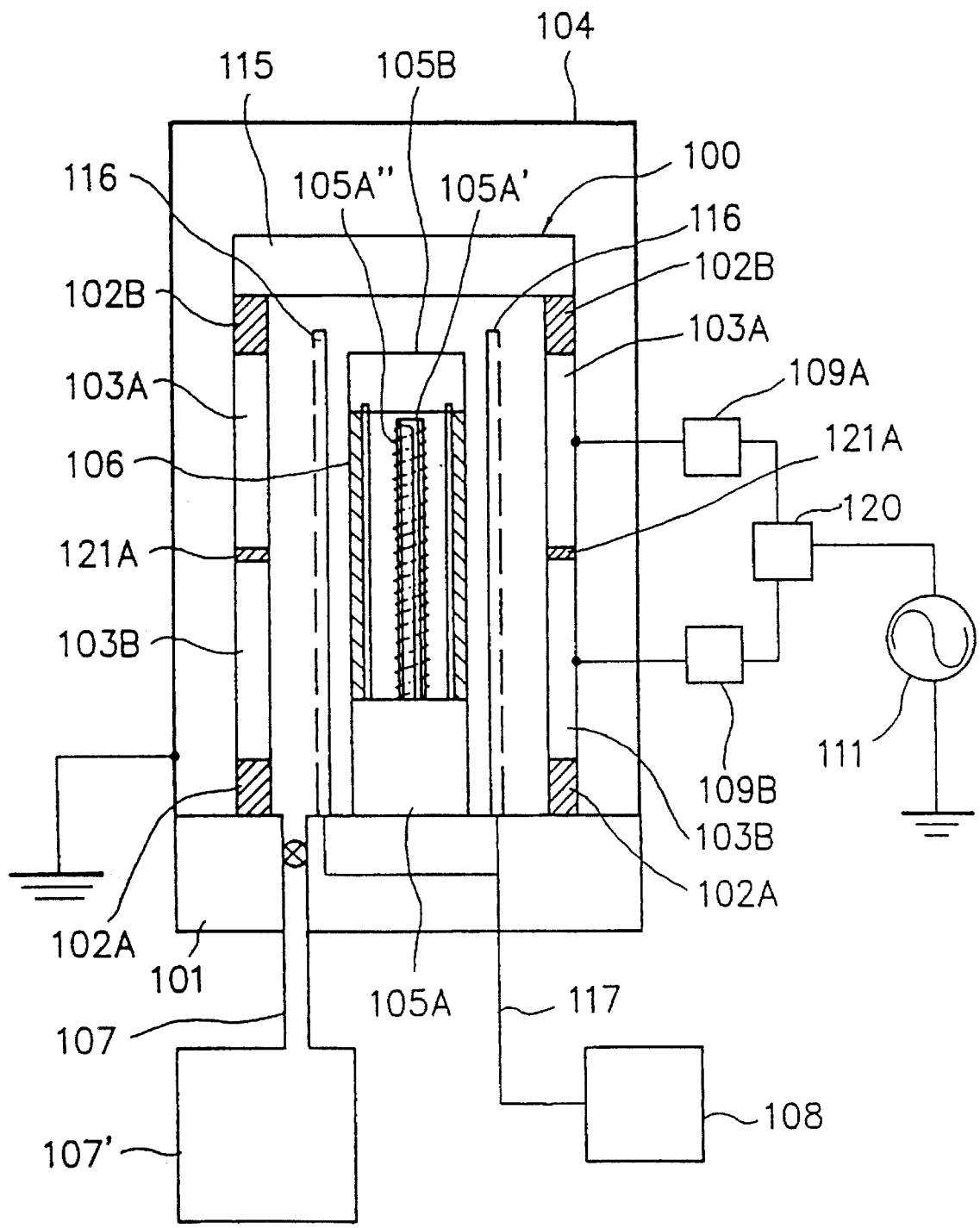
FIG. 18 is a typical view showing one example of a plasma CVD apparatus of the present invention.
Figure 19:
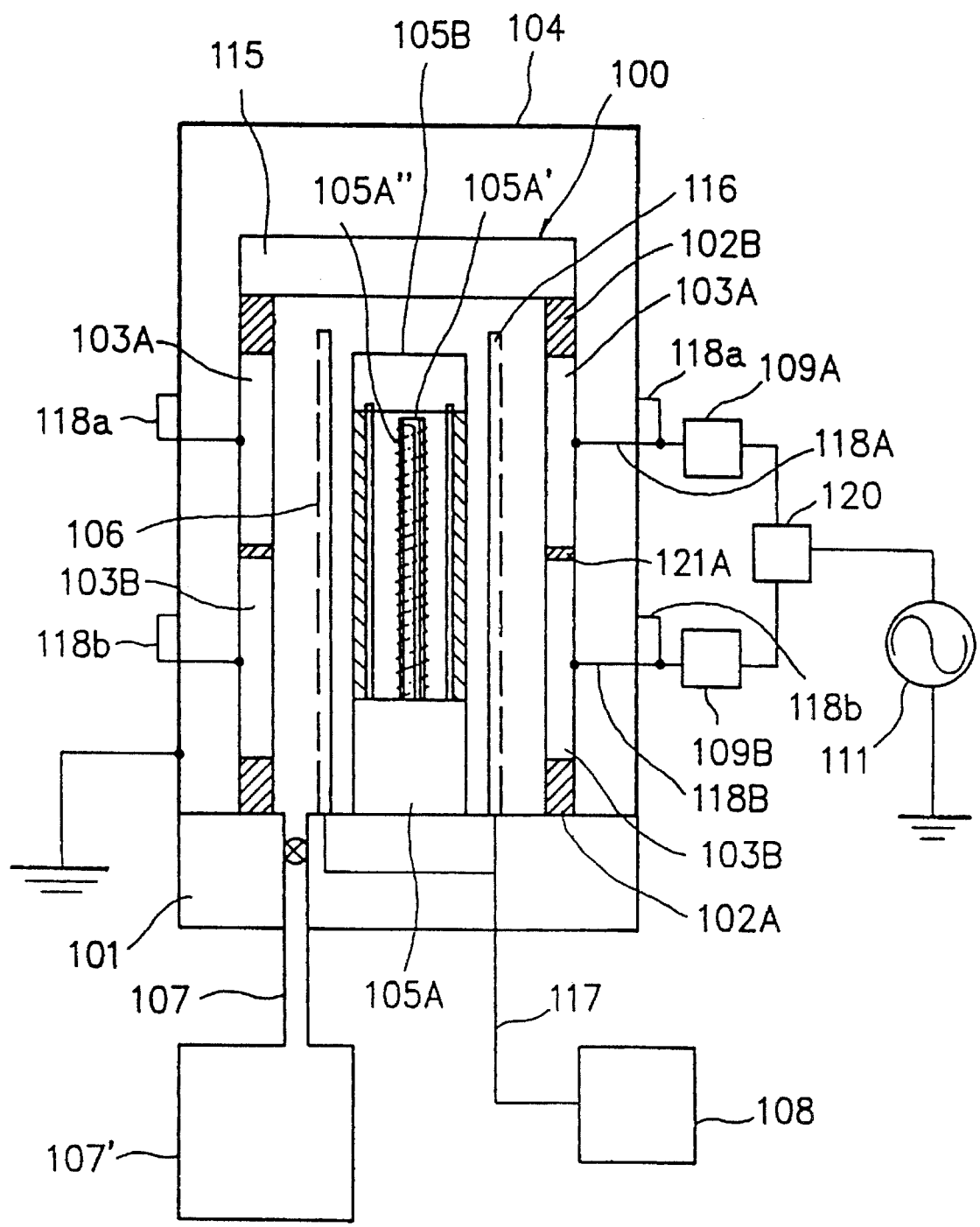
FIG. 19 is a typical view showing one example of a plasma CVD apparatus of the present invention.
Figure 20:
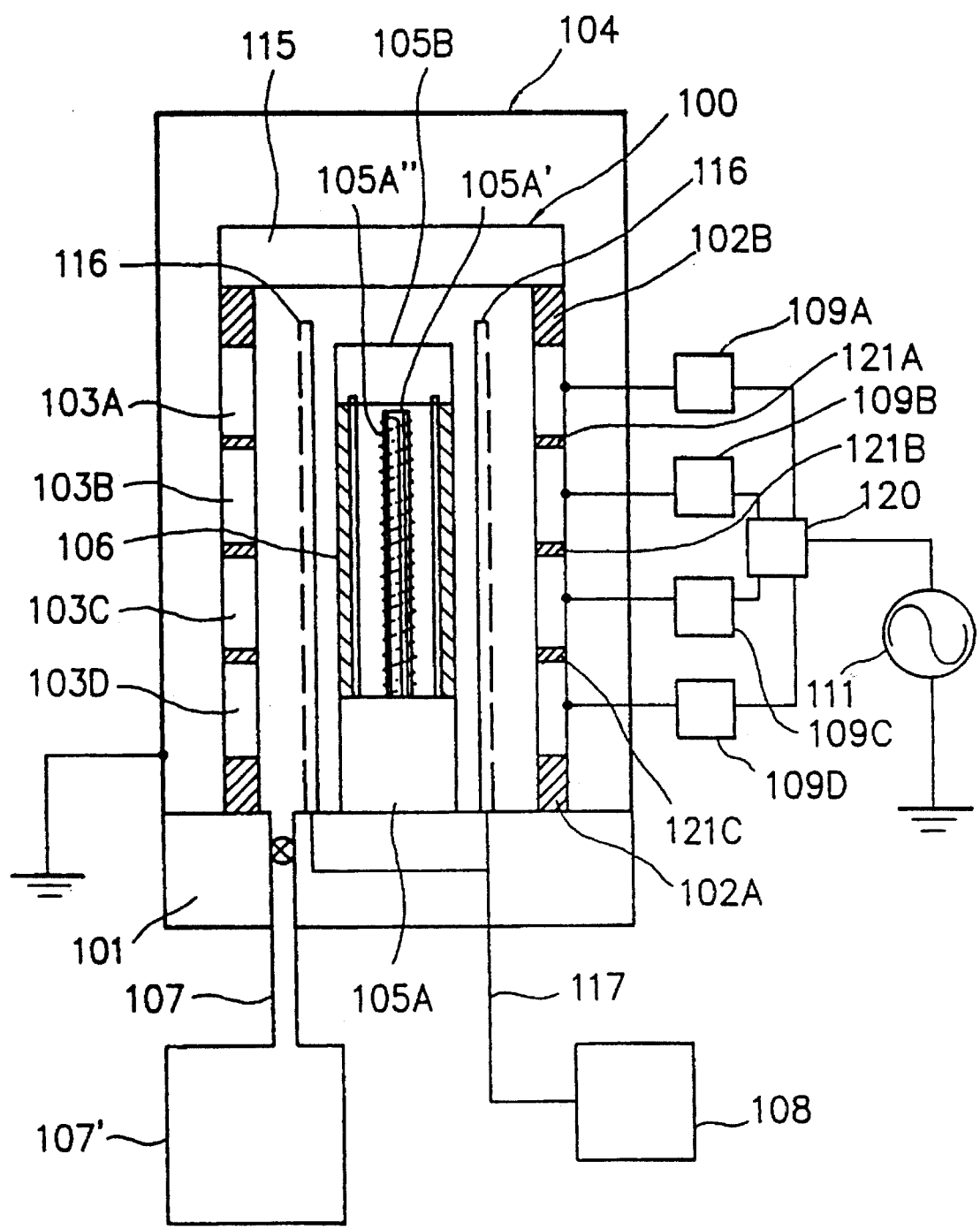
FIG. 20 is a typical view showing one example of a plasma CVD apparatus of the present invention.
Figure 21:
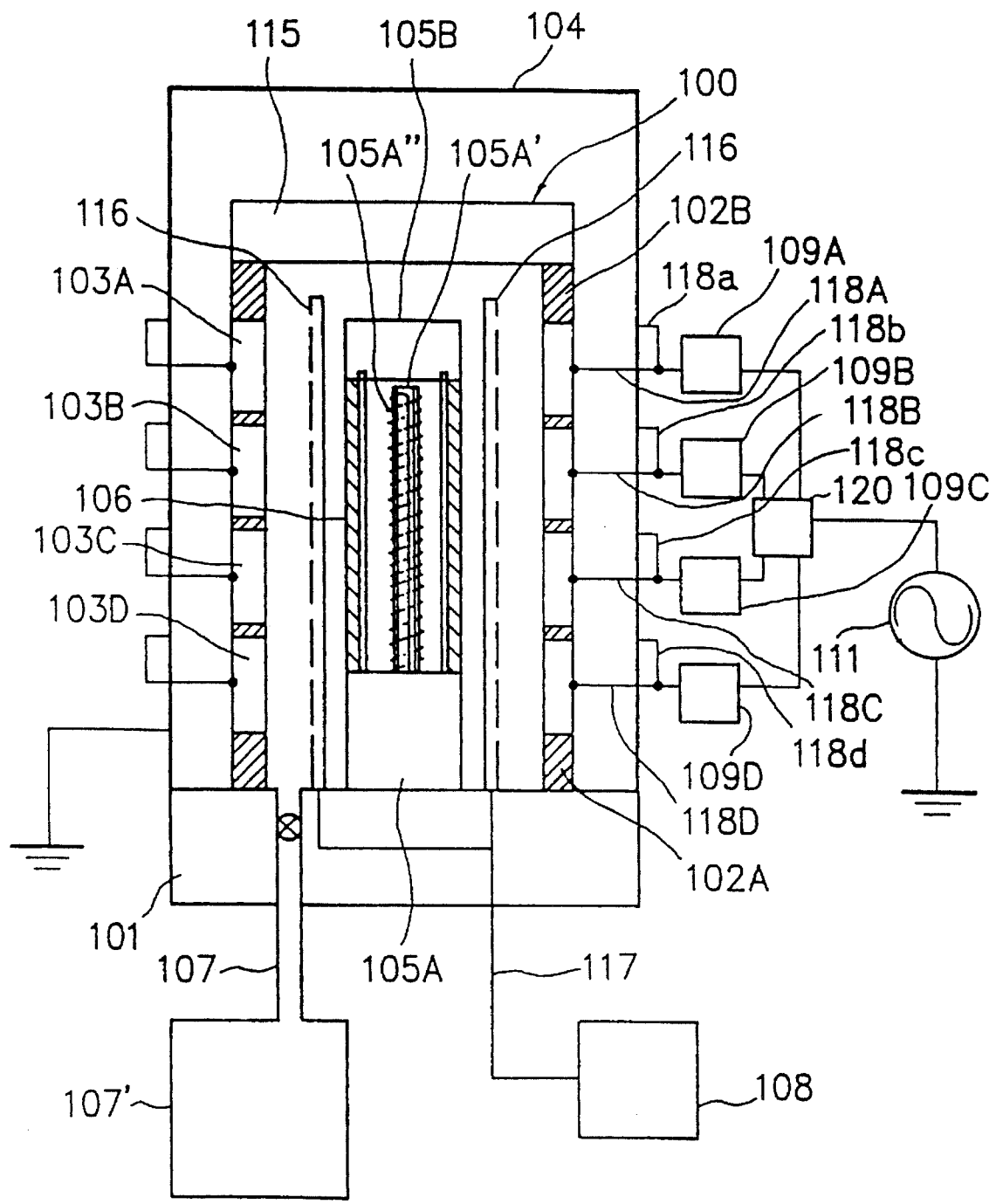
FIG. 21 is a typical view showing one example of a plasma CVD apparatus of the present invention.

We claim:

1. A VHF plasma process comprising the steps of: supplying a raw gas for film formation to a reaction chamber under a reduced pressure; supplying a high frequency power generated by a high frequency power supply having a frequency in the VHF range to a cathode electrode provided around a cylindrical substrate rotatably disposed in said reaction chamber by way of a high frequency power supply means; generating a plasma in a space between said cylindrical substrate and said cathode electrode; and forming a deposited film on the surface of said cylindrical substrate, characterized in that said cathode electrode is electrically divided into a plurality of elements in the axial direction of said cylindrical substrate, and a very-high-frequency energy with a frequency in the range of 60 MHz to 300 MHz is supplied to each of a plurality of said divided cathode electrode elements by way of said high frequency power supply means, thereby generating a plasma in said reaction chamber and forming a deposited film.

2. A VHF plasma CVD process according to claim 1, wherein said very-high-frequency energy per unit area of said cathode electrode is controlled to be supplied to each of said cathode electrode elements substantially in the same amount.

3. A VHF plasma CVD process according to claim 1, wherein said very-high-frequency energy is supplied in the range of from 0.001 W/cm² to 10 W/cm² per unit area of said cathode electrode.

4. A VHF plasma CVD process according to claim 1, wherein the pressure in said reaction chamber upon forming said deposited film is kept in the range of 5 Torr or less.

5. A VHF plasma CVD process according to claim 1, wherein said cylindrical substrate is kept at a temperature between 20° C. to 500° C.

6. A VHF plasma CVD process according to claim 1, wherein said deposited film is a silicon based deposited film.

7. A VHF plasma CVD process according to claim 6, wherein said deposited film is used for an electrophotographic photosensitive member.

8. A VHF plasma CVD process according to claim 1, wherein said frequency is in the range of from 100 MHz to 200 MHz.

9. A VHF plasma process comprising the steps of: supplying a raw gas for film formation to a reaction chamber under a reduced pressure; supplying a high frequency power generated by a high frequency power supply having a frequency in the VHF range to a cathode electrode provided around a cylindrical substrate rotatably disposed in said reaction chamber by way of a high frequency power supply means; generating a plasma in a space between said cylindrical substrate and said cathode electrode; and forming a deposited film on the surface of said cylindrical substrate, characterized in that said cathode electrode is electrically divided into a plurality of elements in the axial direction of said cylindrical substrate, each of said divided cathode electrode elements has independently a plurality of contact points connected to said high frequency power supply means, and a very-high-frequency energy with a frequency in the range of 60 MHz to 300 MHz is supplied to each of a plurality of said divided cathode electrode elements by way of a plurality of said contact points, thereby generating a plasma in said reaction chamber and forming a deposited film.

10. A VHF plasma CVD process according to claim 9, wherein said very-high-frequency energy per unit area of said cathode electrode is controlled to be supplied to each of said cathode electrode elements substantially in the same amount.

11. A VHF plasma CVD process according to claim 9, wherein said very-high-frequency energy is supplied in the range of from 0.001 W/cm$^2$ to 10 W/cm$^2$ per unit area of said cathode electrode.

12. A VHF plasma CVD process according to claim 9, wherein the pressure in said reaction chamber upon forming said deposited film is kept in the range of 5 Torr or less.

13. A VHF plasma CVD process according to claim 9, wherein said cylindrical substrate is kept at a temperature between 20° C. to 500° C.

14. A VHF plasma CVD process according to claim 9, wherein said deposited film is a silicon based deposited film.

15. A VHF plasma CVD process according to claim 14, wherein said deposited film is used for an electrophotographic photosensitive member.

16. A VHF plasma CVD process according to claim 9, wherein said frequency is in the range of from 100 MHz to 200 MHz.

17. A plasma CVD apparatus comprising: a reaction chamber capable of being reduced in pressure; a raw gas supply means for supplying a raw gas for forming a deposited film in said reaction chamber; a substrate support means rotatably disposed in said reaction chamber; a cathode electrode provided around a cylindrical substrate disposed by said substrate support means, and a high frequency power supply with a frequency in the VHF range, wherein a high frequency power generated by said high frequency power supply with a frequency in the VHF range is supplied to said cathode electrode by means of said high frequency power supply means for generating a plasma in a space between said cylindrical substrate and said cathode electrode thereby forming a deposited film on the surface of said cylindrical substrate, characterized in that said cathode electrode is electrically divided into a plurality of elements in the axial direction of said cylindrical substrate, and a very-high-frequency energy with a frequency in the range of 60 MHz to 300 MHz is supplied to each of said divided cathode electrode elements by way of said high frequency power supply means.

18. A plasma CVD apparatus according to claim 17, wherein each of said divided cathode electrode elements is formed in a cylindrical shape.

19. A plasma CVD apparatus according to claim 17, each of said divided cathode electrode elements has a length of 330 mm or less.

20. A plasma CVD apparatus according to claim 17, wherein said very-high-frequency energy is divided into a plurality of energy components by a power distributor, and supplied to each of said divided cathode electrode elements.

21. A plasma CVD apparatus comprising: a reaction chamber capable of being reduced in pressure; a raw gas supply means for supplying a raw gas for forming a deposited film in said reaction chamber; a substrate support means rotatably disposed in said reaction chamber; a cathode electrode provided around a cylindrical substrate disposed by said substrate support means, and a high frequency power supply with a frequency in the VHF range, wherein a high frequency power generated by said high frequency power supply with a frequency in the VHF range is supplied to said cathode electrode by means of said high frequency power supply means for generating a plasma in a space between said cylindrical substrate and said cathode electrode thereby forming a deposited film on the surface of said cylindrical substrate, characterized in that said cathode electrode is electrically divided into a plurality of elements in the axial direction of said cylindrical substrate, each of said divided cathode electrode elements has independently a plurality of contact points connected to said high frequency power supply means, and a very-high-frequency energy with a frequency in the range of 60 MHz to 300 MHz is supplied to each of said divided cathode electrode elements by way of a plurality of said contact points.

22. A plasma CVD apparatus according to claim 21, wherein said contact points are positioned to be symmetric with each other relative to said cylindrical substrate.

23. A plasma CVD apparatus according to claim 21, wherein each of said divided cathode electrode elements is formed in a cylindrical shape.

24. A plasma CVD apparatus according to claim 23, each of said divided cathode electrode elements has a length of 330 mm or less.

25. A plasma CVD apparatus according to claim 21, wherein said very-high-frequency energy is divided into a plurality of energy components by a power distributor, and supplied to each of said divided cathode electrode elements.

* * * * *

UNITED STATES PATENT AND TRADEMARK OFFICE
CERTIFICATE OF CORRECTION

PATENT NO. : 5,540,781
DATED : July 30, 1996
INVENTOR(S) : ATSUSHI YAMAGAMI ET AL.

It is certified that error appears in the above-indentified patent and that said Letters Patent is hereby corrected as shown below:

COLUMN 1

Line 63, "effect" should read --effects--.

COLUMN 2

Line 39, "An" should read --A--.

Please delete the text found at Column 27, line 14-Column 28-line 8 (BRIEF DESCRIPTION OF THE DRAWINGS) and move to and insert at COLUMN 4, line 54.

COLUMN 30

Line 42, "each" should read --wherein each--.

Signed and Sealed this

Twenty-eighth Day of October, 1997

Attest:

BRUCE LEHMAN

Attesting Officer         Commissioner of Patents and Trademarks